(12) United States Patent
Mohapatra et al.

(10) Patent No.: US 10,651,288 B2
(45) Date of Patent: May 12, 2020

(54) PSEUDOMORPHIC INGAAS ON GAAS FOR GATE-ALL-AROUND TRANSISTORS

(71) Applicant: Intel Corporation, Santa Clara, CA (US)

(72) Inventors: Chandra S. Mohapatra, Beaverton, OR (US); Anand S. Murthy, Portland, OR (US); Glenn A. Glass, Portland, OR (US); Willy Rachmady, Beaverton, OR (US); Gilbert Dewey, Hillsboro, OR (US); Jack T. Kavalieros, Portland, OR (US); Tahir Ghani, Portland, OR (US); Matthew V. Metz, Portland, OR (US)

(73) Assignee: Intel Corporation, Santa Clara, CA (US)

( * ) Notice: Subject to any disclaimer, the term of this patent is extended or adjusted under 35 U.S.C. 154(b) by 0 days.

(21) Appl. No.: 15/575,810

(22) PCT Filed: Jun. 26, 2015

(86) PCT No.: PCT/US2015/038105
§ 371 (c)(1),
(2) Date: Nov. 20, 2017

(87) PCT Pub. No.: WO2016/209285
PCT Pub. Date: Dec. 29, 2016

(65) Prior Publication Data
US 2018/0158927 A1 Jun. 7, 2018

(51) Int. Cl.
*H01L 29/66* (2006.01)
*H01L 29/06* (2006.01)
(Continued)

(52) U.S. Cl.
CPC ........ *H01L 29/66522* (2013.01); *B82Y 10/00* (2013.01); *H01L 21/02395* (2013.01);
(Continued)

(58) Field of Classification Search
CPC ........... H01L 29/66522; H01L 29/0653; H01L 29/0673; H01L 29/42392; H01L 29/66469;
(Continued)

(56) References Cited

U.S. PATENT DOCUMENTS 9,023,705 B1   5/2015   Paul et al.
2006/0216897 A1*  9/2006   Lee ........................ B82Y 10/00
                                      438/282

(Continued)

OTHER PUBLICATIONS

International Search Report and Written Opinion for International Patent Application No. PCT/US2015/038105 dated Mar. 25, 2016, 16 pgs.

(Continued)

*Primary Examiner* — Tong-Ho Kim
(74) *Attorney, Agent, or Firm* — Schwabe, Williamson & Wyatt, P.C.

(57) ABSTRACT

A non-planar gate all-around device and method of fabrication thereby are described. In one embodiment, a multi-layer stack is formed by selectively depositing the entire epi-stack in an STI trench. The channel layer is grown pseudomorphically over a buffer layer. A cap layer is grown on top of the channel layer. In an embodiment, the height of the STI layer remains higher than the channel layer until the formation of the gate. A gate dielectric layer is formed on and all-around each channel nanowire. A gate electrode is formed on the gate dielectric layer and surrounding the channel nanowire.

17 Claims, 14 Drawing Sheets

(51) Int. Cl.
- *H01L 29/423* (2006.01)
- *H01L 29/78* (2006.01)
- *H01L 29/786* (2006.01)
- *H01L 21/762* (2006.01)
- *H01L 29/775* (2006.01)
- *H01L 29/20* (2006.01)
- *H01L 21/02* (2006.01)
- *H01L 29/205* (2006.01)
- *B82Y 10/00* (2011.01)
- *H01L 21/306* (2006.01)

(52) U.S. Cl.
CPC .. *H01L 21/02455* (2013.01); *H01L 21/02538* (2013.01); *H01L 21/02603* (2013.01); *H01L 21/02639* (2013.01); *H01L 21/762* (2013.01); *H01L 29/0653* (2013.01); *H01L 29/0673* (2013.01); *H01L 29/20* (2013.01); *H01L 29/205* (2013.01); *H01L 29/42392* (2013.01); *H01L 29/6653* (2013.01); *H01L 29/6681* (2013.01); *H01L 29/66469* (2013.01); *H01L 29/66545* (2013.01); *H01L 29/66553* (2013.01); *H01L 29/66742* (2013.01); *H01L 29/775* (2013.01); *H01L 29/78* (2013.01); *H01L 29/7853* (2013.01); *H01L 29/78681* (2013.01); *H01L 29/78696* (2013.01); *H01L 21/30612* (2013.01)

(58) Field of Classification Search
CPC ........... H01L 29/6653; H01L 29/66545; H01L 29/66553; H01L 29/66742; H01L 29/6681; H01L 29/775; H01L 29/78; H01L 29/53; H01L 29/78681; H01L 29/78696; H01L 21/30612
USPC .......................................................... 257/29
See application file for complete search history.

(56) References Cited

U.S. PATENT DOCUMENTS

| | | |
|---|---|---|
| 2007/0257301 A1 | 11/2007 | Allibert et al. |
| 2012/0132958 A1* | 5/2012 | Marino ............... H01L 29/1037 257/194 |
| 2013/0099283 A1 | 4/2013 | Lin et al. |
| 2013/0161756 A1 | 6/2013 | Glass et al. |
| 2013/0234147 A1 | 9/2013 | Wu et al. |
| 2013/0277714 A1* | 10/2013 | Le ..................... H01L 29/42392 257/190 |
| 2014/0084387 A1 | 3/2014 | Dewey et al. |
| 2014/0225065 A1* | 8/2014 | Rachmady ........ H01L 29/42392 257/24 |

OTHER PUBLICATIONS

International Preliminary Report on Patentability for International Patent Application No. PCT/US201/038105, dated Jan. 4, 2018, 13 pages.
Search Report for European Patent Application No. 15896571.5, dated Jan. 2, 2019, 9 pgs.

* cited by examiner

US 10,651,288 B2

PSEUDOMORPHIC INGAAS ON GAAS FOR GATE-ALL-AROUND TRANSISTORS

CROSS-REFERENCE TO RELATED APPLICATION

This patent application is a U.S. National Phase Application under 35 U.S.C. § 371 of International Application No. PCT/US2015/038105, filed Jun. 26, 2015, entitled "PSEUDOMORPHIC INGAAS ON GAAS FOR GATE-ALL-AROUND TRANSISTORS," which designates the United States of America, the entire disclosure of which is hereby incorporated by reference in its entirety and for all purposes.

FIELD OF THE INVENTION

Embodiments of this invention relate to the field of semiconductor devices and more particularly to a non-planar gate all-around device and method of fabrication.

BACKGROUND OF THE INVENTION

For the past several decades, the scaling of features in integrated circuits has been a driving force behind an ever-growing semiconductor industry. Scaling to smaller and smaller features enables increased densities of functional units on the limited real estate of semiconductor chips. For example, shrinking transistor size allows for the incorporation of an increased number of memory devices on a chip, lending to the fabrication of products with increased capacity. The drive for ever-more capacity, however, is not without issue. The necessity to optimize the performance of each device becomes increasingly significant.

The further reduction in scale of integrated circuit devices has called for the increased usage of non-planar transistors such as tri-gate transistors, FinFETs, TFETS, omega-FETs, and double-gate transistors. Among the non-planar transistors, Gate-All-Around transistors provide a better control of the channel by having a gate structure surrounding the channel on four surfaces. However, maintaining mobility improvements while increasing short channel control is still a major challenge. Many different techniques have been attempted to improve controlling source to drain leakage, however, significant improvements are still needed.

BRIEF DESCRIPTION OF THE DRAWINGS

Embodiments of the present disclosure are illustrated by way of example, and not by way of limitation, in the figures of the accompanying drawings, in which.

DETAILED DESCRIPTION

Figure 1:
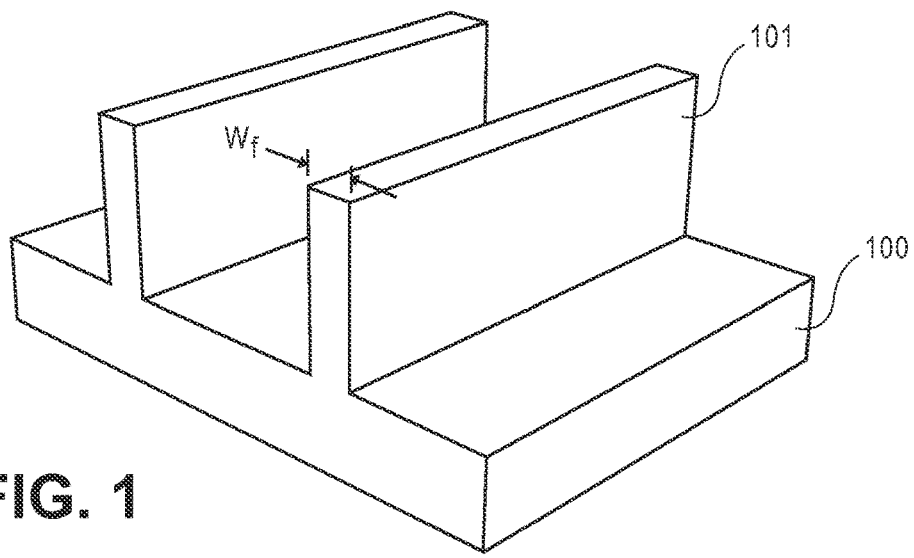
FIG. 1 illustrates a perspective view of the device that includes a plurality of fins formed on a substrate, according to an embodiment.

Embodiments of present invention are directed to a novel gate all-around transistor and a method of its fabrication. In the following description, numerous details are set forth in order to provide a thorough understanding of the present invention. It will be apparent, however, to one skilled in the art, that the present invention may be practiced without these specific details. In other instances, well-known semiconductor processes and manufacturing techniques have not been described in detail to avoid obscuring the present invention. Reference throughout this specification to "an embodiment"

means that a particular feature, structure, function, or characteristic described in connection with the embodiment is included in at least one embodiment of the invention. Thus, the appearances of the phrase "in an embodiment" in various places throughout this specification are not necessarily referring to the same embodiment of the invention. Furthermore, the particular features, structures, functions, or characteristics may be combined in any suitable manner in one or more embodiments. For example, a first embodiment may be combined with a second embodiment anywhere the two embodiments are not mutually exclusive.

Embodiments of the present invention relate to the fabrication of a non-planar gate-all-around transistor device. In an embodiment of the invention, the channel layer is pseudomorphically grown over a buffer layer such that the thickness of the channel layer is smaller than its critical thickness. The pseudomorphic growth provides the buffer layer and the channel layer with a coherent interface between the two layers (functionally lattice matched), preventing undesirable strain and misfit dislocations, and enhancing the channel electron mobility.

In an embodiment of the invention, a multi-layer stack is formed by selectively depositing the entire epi-stack in an STI trench. Thus, the semiconductor component disclosed is fabricated using the new and improved method of fabricating semiconductor components in-situ (i.e. without removing the structure from the epitaxial chamber) and in a continuous integrated sequence. Previously, a recess and regrowth scheme was used to grow an epi-stack. However, removing the wafer from the deposition chamber exposed the top surface of the layers to air which presumably has the effect of introducing oxygen and/or water vapor into or onto the layers. The disclosed in-situ formation of the multi-layer stack curtails the adverse effects of air-break and planarization, keeping the channel surfaces clean.

In an embodiment of the invention, the multi-layer stack is formed in a narrow STI trench, such that defects due to lattice mismatch are terminated by defect trapping in the substructure. Furthermore, the height of the STI layer remains higher than the channel layer, and a cap layer and buffer layer surrounds the channel layer from the top and bottom until the formation of the gate. The fully covered surfaces of the channel layer maintain the channel layer clean against defects, contamination, and unintentional erosion.

Referring to FIG. 1, a substrate 100 with a plurality of fins 101 is illustrated. The number of fins 101 formed on the substrate 100 can be adjusted to an appropriate number, as it is understood to those skilled in the art. In an embodiment, the fins 101 are formed using an etching process. A patterning etch mask is placed on the substrate 100. Thereafter, the substrate 100 is etched and the portions of the substrate protected by the mask form the fins 101. The etch masks are then removed.

In an embodiment, the substrate 100 may be formed of any appropriate material. In an embodiment, the substrate 100 may be a crystalline substrate formed using a bulk silicon or a silicon-on-insulator (SOI) substructure. In other embodiments, the semiconductor substrate 100 may be formed using alternative materials, which may or may not be combined with silicon. Such materials may include, but are not limited to, germanium, indium antimonide, lead telluride, indium arsenide, indium phosphide, gallium arsenide, indium gallium arsenide, gallium antimonide, or other combinations of group III-V or group IV materials. In another embodiment, the substrate 100 comprises a germanium substrate, a germanium-on-insulator substrate (GeOI), or a germanium-on-nothing substrate (GeON). Although a few examples of materials from which the substrate 100 may be formed are described here, any material that may serve as a foundation upon which a semiconductor device may be built falls within the spirit and scope of the present invention.

In an embodiment, the fins 101 are formed from the same material as the substrate 100. In an embodiment, the fins 101 are high aspect ratio fins. In an embodiment, the high aspect ratio fins may have a height to width ratio that is 2:1, or greater. An additional embodiment may include fins 101 that have a height to width ratio that is 10:1, or greater. In an embodiment, the width $W_F$ of the fins 101 is chosen to have a width that is substantially equal to the desired width of a nanowire channel that will subsequently be formed and explained in greater detail below. By way of example the width $W_F$ of the fins 101 may be between 10-20 nm.

Figure 2:
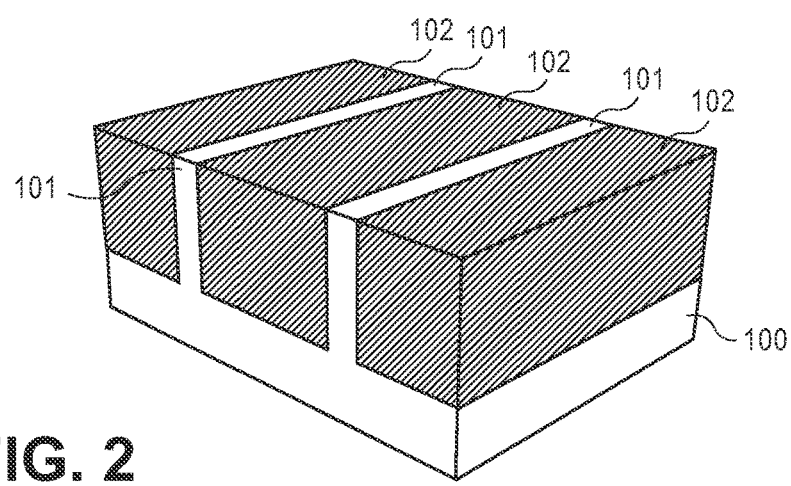
FIG. 2 illustrates a perspective view of the device after a shallow trench isolation (STI) layer is formed on top of the substrate and the fins, according to an embodiment.

Referring to FIG. 2, a shallow trench isolation (STI) layer 102 may be formed over the top surfaces of the substrate 100 and fins 101. In an embodiment, any appropriate deposition process such as a chemical vapor deposition (CVD) process can be used to deposit a STI layer over the substrate 100 and the fin 101. The STI layer may be deposited to height greater than a top surface of the fins 101. Then, as shown in FIG. 2, the STI layer 102 is planarized to expose the top surface of the fins 101. For example, the STI layer 102 may be planarized with a chemical-mechanical polishing (CMP) operation.

In an embodiment, the STI layer 102 may be formed from any appropriate insulating material. For example, the STI layer 102 may be an oxide, such as a silicon oxide. According to an additional embodiment, the STI layer 102 may include a plurality of dielectric materials. For example, a first dielectric material may be a conformal material and a second dielectric material may be a fill material.

Figure 3:
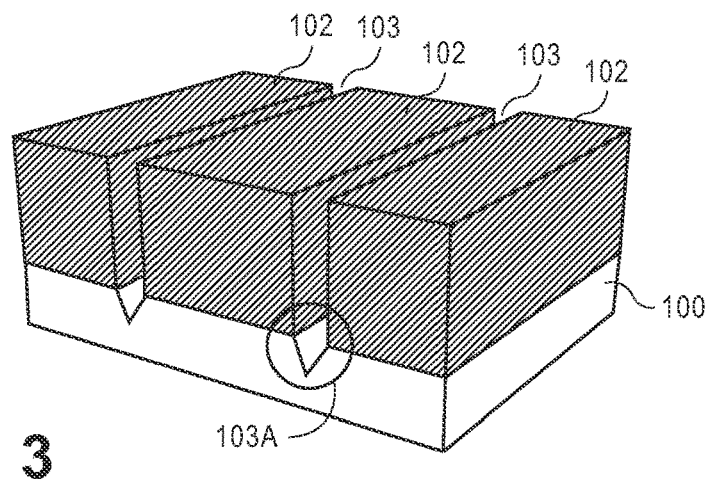
FIG. 3 illustrates a perspective view of the device after the fins are recessed to form a plurality of trenches, according to an embodiment.

Referring to FIG. 3, the fins 101 may be removed to form a trench 103. The fins 101 may be removed by any known etching techniques, including, but not limited to, dry etching, wet etching, or combinations thereof. In an embodiment, the trench 103 is an aspect ratio trapping (ART) trench. As used herein, ART refers generally to the defect trapping technique of causing defects to terminate at non-crystalline, e.g., dielectric sidewalls, where the sidewalls are sufficiently high relative to the size of the growth area so as to trap most, if not all, of the defects. ART utilizes high aspect ratio openings, such as trenches or holes, to trap dislocations, preventing them from reaching the epitaxial surface, and greatly reduces the surface dislocation density within the ART opening.

According to an embodiment, the fins 101 are not entirely removed during the etching operation. In such an embodiment, a residual material of the fin 101 may remain at the bottom of the trench 103. In one embodiment, a bottom portion 103a of trench 103 may have a {111} faceting, which may facilitate the growth of a III-V material. In one embodiment the {111} faceting may be formed by an etching chemistry used during the etching operation that selectively etches the fins 101 along a desired crystallographic plane. In another embodiment the bottom portion 103a of the trench 103 may extend into the substrate 100 either during the removal of the fins 101 or thereafter. In such an embodiment the bottom portion of the trench may have a {111} faceting formed in the substrate 100.

Figure 4A:
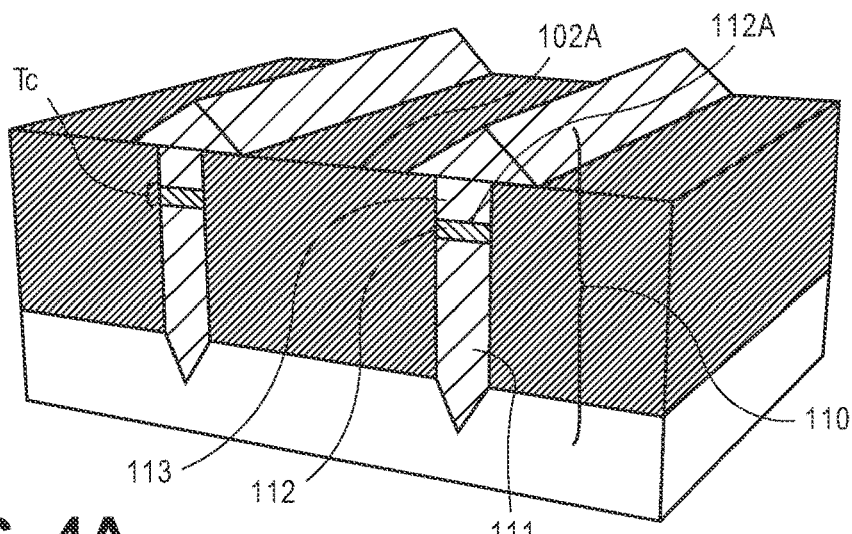
FIG. 4A illustrates a perspective view of the device after multi-layer stacks are formed in the trenches, according to an embodiment.

Referring to FIG. 4A, a multi-layer stack 110 is formed in the trench 103. The multi-layer stack 110 includes a plurality of individual layers. In an embodiment, the multi-layer stack 110 includes three distinct layers. The bottommost layer of the multi-layer stack 110 is a buffer layer 111. The buffer layer 111 may be formed over the residual material remained on the bottom of the trench 103 explained above. A channel layer 112 may be formed over the buffer layer 111. A cap layer 113 may be formed over the channel layer 112. While three layers are illustrated in FIG. 4A, it is to be appreciated that more than three layers may be included in the multi-layer stack 110. For example, the multi-layer stack 110 may further include a seed layer between the substrate 100 and the buffer layer 111. The seed layer may be a base layer for growing the buffer layer. In an embodiment, additional graded buffer layers may be formed between the substrate 100 and the channel layer 112.

Figure 4B:
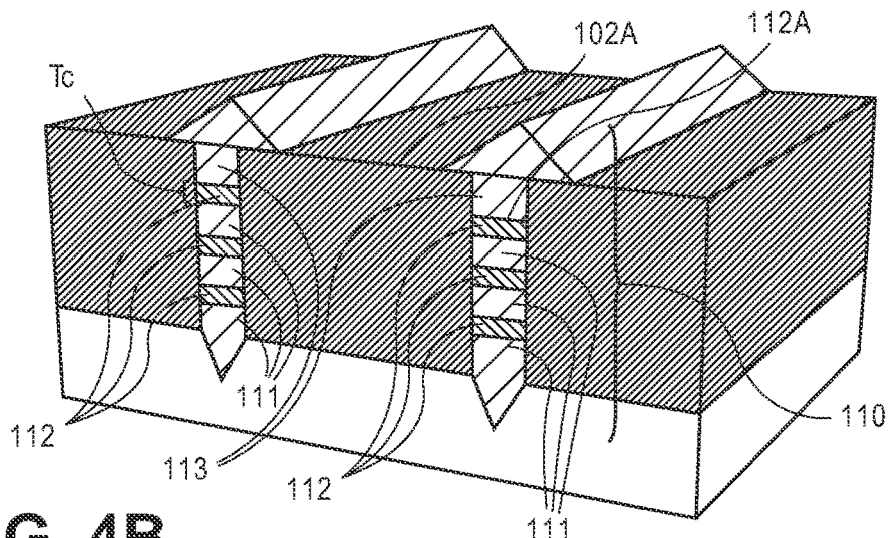
FIG. 4B illustrates a perspective view of the device after multi-layer stacks including multiple channel layers are formed in the trenches, according to an embodiment.

In another embodiment, as shown in FIG. 4B, multiple channel layers are formed within the trench 103. The channel layers may be separated by buffer layer in between adjacent channel layer. Referring to FIG. 4B, the channel layers 112 is grown on top of the underlying buffer layers 111. In an embodiment, the channel layers 112 have different thicknesses. Such an embodiment, as explained further below, may allow for a plurality of nanowires to be formed between each replacement Source and Drain regions. While three channel layers 112 are shown in FIG. 4B, it is to be appreciated that embodiments may also include two channel layers, or more than three channel layers. Aside from the alteration to the layers used to form the multi-layer stack 110, the processing necessary to form the device illustrated in FIG. 4B may be substantially similar to the processing described in details above.

Referring back to FIG. 4A, the buffer layer 111 may be epitaxially grown over the bottom portion 103a of trench 103. In an embodiment, the buffer layer 111 is composed of a different material than the residual material in the bottom portion 103a of a trench 103. In an embodiment, the buffer layer 111 may be epitaxially grown by any known formation process including an atomic layer deposition (ALD), metalorganic chemical vapor deposition (MOCVD), or chemical vapor deposition (CVD) processes. In an embodiment, the ART feature of the trench 103 prevents the defect within the buffer layer 111 to reach its surface.

In an embodiment, the buffer layer 111 can be composed of any appropriate material that provides a good etch selectivity with respect to the channel layer 112 and enables pseudomorphic growth of the channel layer 112 as explained below. The buffer layer 111 can be composed of a high band-gap III-V material. For the purpose of the present description, a high band-gap material may be defined to be a material that has a band-gap greater than silicon. Furthermore, the high aspect ratios of the trench 103 may prevent the use of materials that have poor fill characteristics. For example, when a material is deposited in a high aspect ratio trench, the resulting layer may have a significant number of voids and/or other defects. Accordingly, embodiments of the invention include materials for the buffer layer 111 that may be epitaxially grown on the bottom portion 103a of the trench 103 without the formation of a significant number of voids or other defects. For example, the buffer layer 111 may be composed of indium aluminum arsenide, indium phosphide, gallium phosphide, gallium arsenide, gallium arsenide antimonide, aluminium arsenide antimonide, indium aluminum gallium arsenide, indium aluminum gallium phosphide, aluminum gallium arsenide, and the like. The buffer layer 111 may be grown to a height greater than half of the depth of the trench 103, for example between 50-150 nm.

In an embodiment of the invention, the channel layer 112 may be formed over the top surface of the buffer layer 111. By way of example, the channel layer 112 may be formed with an ALD, MOCVD, CVD, or MBE process. In an embodiment, a top surface 112a of the channel layer 112 is lower than a top surface 102a of the STI layer 102. In one embodiment, the width of the channel layer 112 is confined by the sidewalls of the trench 103. In an embodiment, the width of the channel layer 112 is extended straight and in parallel with the width of the buffer layer 111.

Figure 4C:
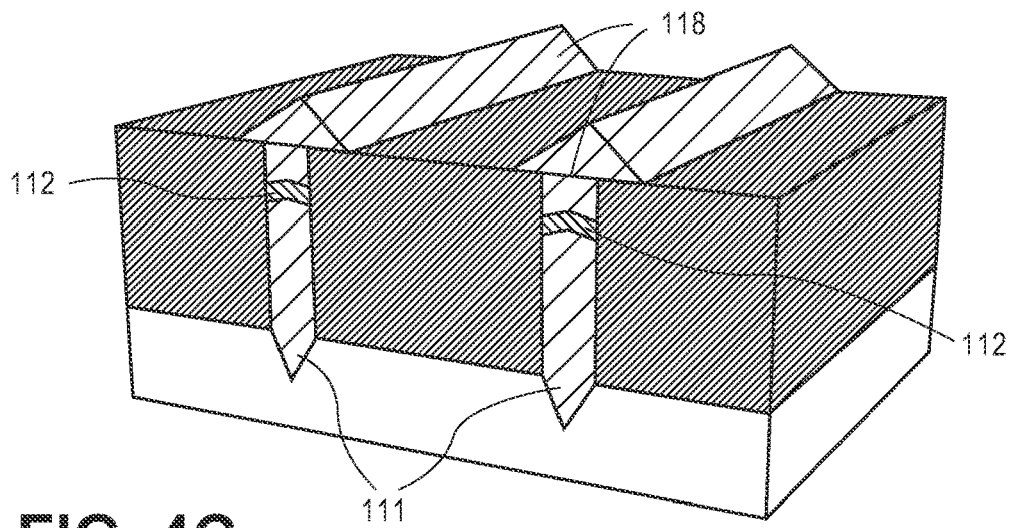
FIG. 4C illustrates a perspective view of the device having a chevron shaped channel layer, according to an embodiment.

Referring to FIG. 4C, in another embodiment, the channel layer 112 is formed in an inverted "V" shape or a chevron shape with the vertex or apex of chevron pointing upward. In such an embodiment, the chevron shaped channel layer 112 creates a further surface area and thus increased transistor drive capability. This additional drive capability is provided without increasing lateral transistor area and therefore forms a very compact and size efficient transistor.

The channel layer 112 preferably has a lattice parameter close to that in the underlying buffer layer 111. The channel layer 112 may be formed by any appropriate material such as a low band-gap III-V epitaxial material. For the purpose of the present description, a low band-gap material may be defined to be a material that has a band-gap less than silicon. For example, the channel layer 112 may be formed by indium gallium arsenide, indium arsenide, indium antimonide, and the like.

In an embodiment of the invention, the channel layer 112 is psedumorphically grown over the buffer layer 111. While lattice mismatch in heteroepitaxial systems leads to defect generation in relatively thick epitaxially grown layers, thin strained epitaxial layers can be grown without crystal defects even when grown on grossly lattice mismatched substrates, such growth is referred to as pseudomorphic growth. Avoidance of crystal defects is achieved by imposing a thickness limitation on the epitaxial layers known as critical thickness. As such, the channel layer 112 may be grown to a thickness $T_C$ less than its critical thickness. For example, although the lattice constant of Indium gallium arsenide (InGaAs) is larger than that of Gallium arsenide (GaAs), it is possible to epitaxially grow a high quality InGaAs layer on a GaAs substrate by pseudomorphic growth, i.e., by compulsorily matching the lattice constant of the InGaAs layer in a direction parallel to the surface of the GaAs substrate with the lattice constant of the GaAs substrate, as long as the InGaAs layer is thinner than the critical thickness at which dislocations start to occur due to lattice mismatch.

The critical thickness of the channel layer 112 depends on the lattice mismatch between the buffer layer 111 and the channel layer 112. Generally, greater the difference between the two lattice constants, the smaller the critical thickness of the channel layer. Typically, a mismatch of about 1-5% quires a critical thickness of about 1-100 nm. For example, in an embodiment, the buffer layer 111 is formed of GaAs and the channel layer is formed of InGaAs with lattice mismatch of 4% while the channel layer has a thickness of 10-12 nm.

As further shown in FIG. 4, a cap layer 113 may be grown over the top surface 112a of the channel layer 112. By way of example, the cap layer 113 may be formed with an ALD, MOCVD, CVD, or MBE process. The cap layer 113 preferably has a lattice parameter close to that in the underlying channel layer 112. The cap layer 113 could be composed of any appropriate material, such as a high band-gap III-V material. For example, the cap layer 113 may be composed of indium aluminum arsenide, indium phosphide, gallium phosphide, gallium arsenide, gallium arsenide antimonide, aluminium arsenide antimonide, indium aluminum gallium arsenide, indium aluminum gallium phosphide, aluminum gallium arsenide, and the like.

In an embodiment of the invention, the cap layer 113 is composed of the same material as the buffer layer 111. In an embodiment, the material used for the buffer layer 111 and the cap layer 113 may be chosen based on their etch selectivity to the material used for the channel layer 112. In an embodiment, the buffer layer 111 and the cap layer 113 may be indium phosphide (InP) and the channel layer 112 may be indium-gallium-arsenide (InGaAs). By way of example, a wet etchant that includes a mixture of hydrogen chloride (HCl) and sulfuric acid ($H_2SO_4$) may selectively etch the InP buffer and cap layers 111 and 113 over the InGaAs channel layer 112. While InP and InGaAs are used as exemplary embodiments, it is to be appreciated that any number of material combinations may be used so long as the buffer layer 111 and the cap layer 113 are selectively etched with respect to the channel layer 112. For example, the buffer layer 111 and the cap layer 113 can be made of GaAs and the channel layer 112 may be made of InGaAs. In such an embodiment, any appropriate hydroxide containing etchants, for example potassium hydroxide (KOH), can be used to selectively etch the buffer layer 111 and cap layer 113 without etching the channel layer 112.

In an embodiment of the invention, a top surface of the cap layer 113 is above the top surface 102a of the STI layer. In an embodiment, the height of the unfilled portion of the trench 103 before growing the cap layer 113 is defined by the top surface 112a of the channel layer 112 to the top surface 102a of the STI layer 102. In an embodiment, the width of the cap layer 113 is confined by the sidewalls of the trench 103 until the cap layer 113 begins to grow above the trench 103. After the cap layer 113 grows beyond the trench 103, the width of the layer may begin to grow since it is no longer confined.

Figure 5:
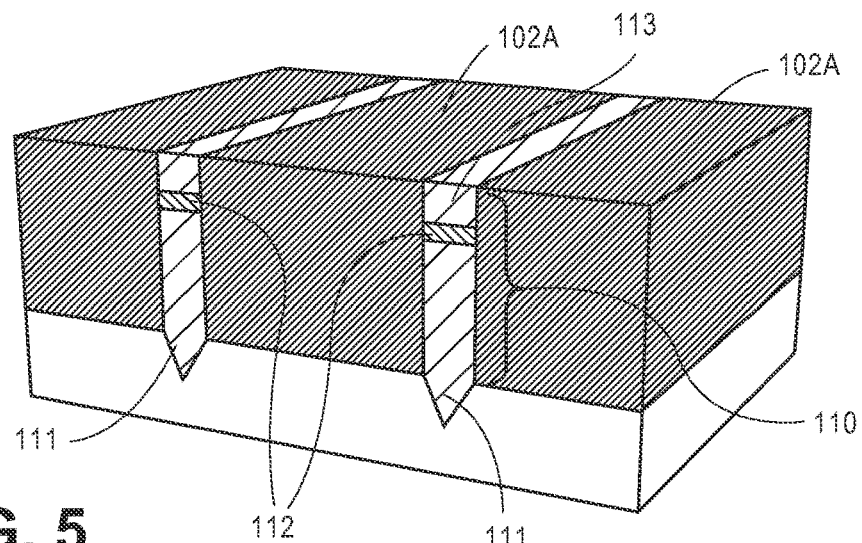
FIG. 5 illustrates a perspective view of the device after a cap layer is polished to the same height as the STI layer, according to an embodiment.

Referring to FIG. 5, an embodiment of the invention may include a planarization. The planarization process may remove any overgrowth of the cap layer 113 that has extended out of the trench 103 and above the top surface 102a of the STI layer 102. For example, top surfaces of the cap layer 113 and the STI layer 102 may be planarized with a CMP process.

Referring to FIG. 5, the multi-layer stack 110 is formed by selectively depositing the entire epi-stack, beginning with buffer layer 111, then the channel layer 112, and finally the cap layer 113. Thus, the semiconductor component disclosed is fabricated using the new and improved method of fabricating semiconductor components in-situ (i.e. without removing the structure from the epitaxial chamber) and in a continuous integrated sequence. Traditionally, removing the wafer from the deposition chamber exposes the top surface of the layers to air which presumably has the effect of introducing oxygen and/or water vapor into or onto the layers. The in-situ formation of the multi-layer stack 110 curtails the adverse effects of air-break and planarization, keeping the channel surfaces clean.

Figure 6:
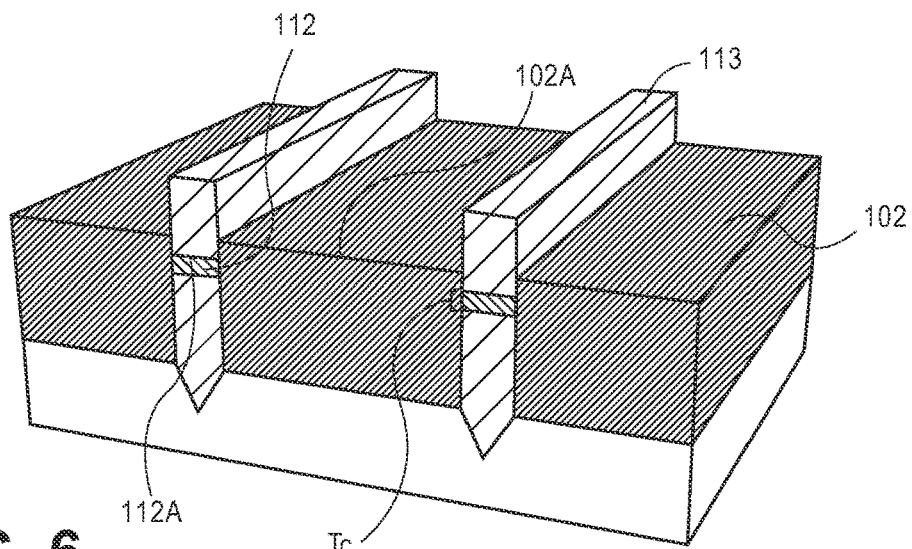
FIG. 6 illustrates a perspective view of the device after the STI layer is recessed to expose the cap layer within the multi-layer stacks, according to an embodiment.

Referring to FIG. 6, the STI layer 102 may be recessed. In an embodiment, an etching process is used to recess the STI layer 102 without etching the cap layer 113. As such, at least a portion of the cap layer 113 extends above the top surface 102a of the STI layer 102. In an embodiment, the STI layer is recessed to a height such that the top surface 102a of the STI structure 102 remains above the top surface 112a of the channel layer 112. In an embodiment, the height difference between the top surface 112a of the channel layer 112 and the top surface 102a of the STI layer 102 is between 10-20 nm. In an embodiment, the channel layer 112 is fully surrounded by the cap layer 113 from the top, the buffer layer 111 from the bottom, and the STI layer 102 from both sides. The fully covered surfaces of the channel layer 112 maintain the channel layer clean against defects, contaminations, and unintentional erosions.

Figure 7:
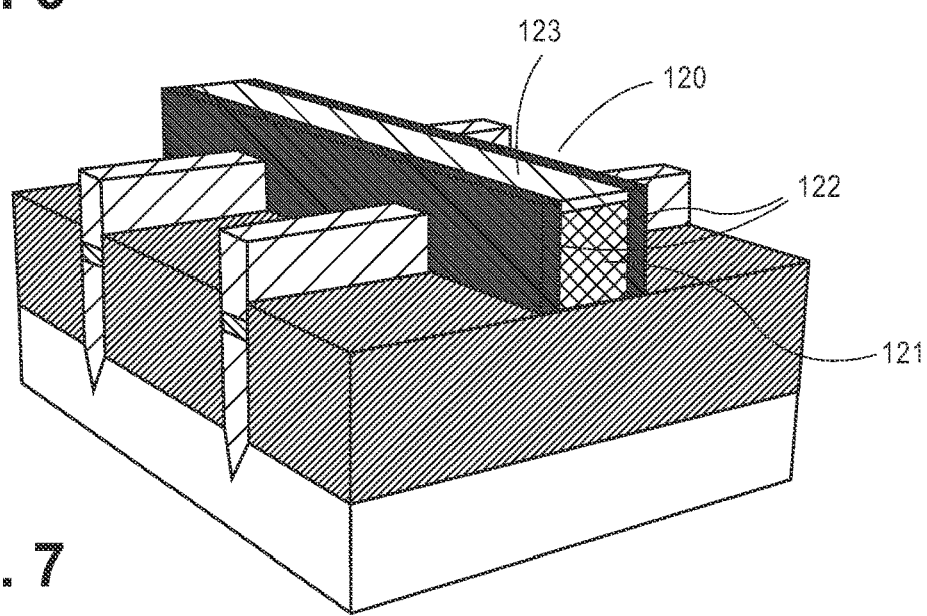
FIG. 7 illustrates a perspective view of the device after a sacrificial gate electrode and sidewall spacers are formed over the cap layer and the STI layer, according to an embodiment.

Referring to FIG. 7, a gate 120 is formed over center portions of the cap layer 113 and the STI layer 102. The gate 120 is extended perpendicular to the cap layer 113. The gate 120 is fabricated by initially forming a sacrificial gate electrode 121 over a center portion of the cap layer 113 that extends above the top surface 102a and a portion of the STI layer. A layer of the material used to form the sacrificial gate electrode 121 may be blanket deposited over the exposed surfaces and patterned to form the sacrificial gate electrode 121. The sacrificial gate electrode 121 may be formed by any appropriate material including one of polysilicon, germanium, silicon germanium, silicon nitride, silicon oxide, or a combination thereof. In an embodiment, a hard mask 123 is formed on top of the sacrificial gate electrode 121. In an embodiment, the hard mask 123 protects the sacrificial gate electrode 121 from being exposed during the proceeding steps.

Referring to FIG. 7, a pair of sidewall spacers 122 may be formed on opposite sidewalls of sacrificial gate electrode 121. The region between the two sidewall spacers 122 is referred to as the gate region herein. The pair of sidewall spacers 122 may be formed using conventional methods of forming sidewall spacers known in the art. In an embodiment, a conformal dielectric spacer layer, such as, but not limited to, silicon oxide, silicon nitride, silicon oxynitride and combinations thereof, is first blanket deposited on all structures, including the cap layer 113 and sacrificial gate electrode 121. The dielectric spacer layer may be deposited using conventional CVD methods such as low pressure chemical vapor deposition (LPCVD), plasma enhanced chemical vapor deposition (PECVD), and atomic layer deposition (ALD). In an embodiment, the dielectric spacer layer is deposited to a thickness of between approximately 2 and 10 nm. Thereafter, a commonly known spacer-etching process may be used to remove the excess dielectric material and leave behind the sidewall spacers 122. In an embodiment, the hard mask 123 and the sidewall spacers 122 completely encapsulate the sacrificial gate electrode 121.

Figure 8:
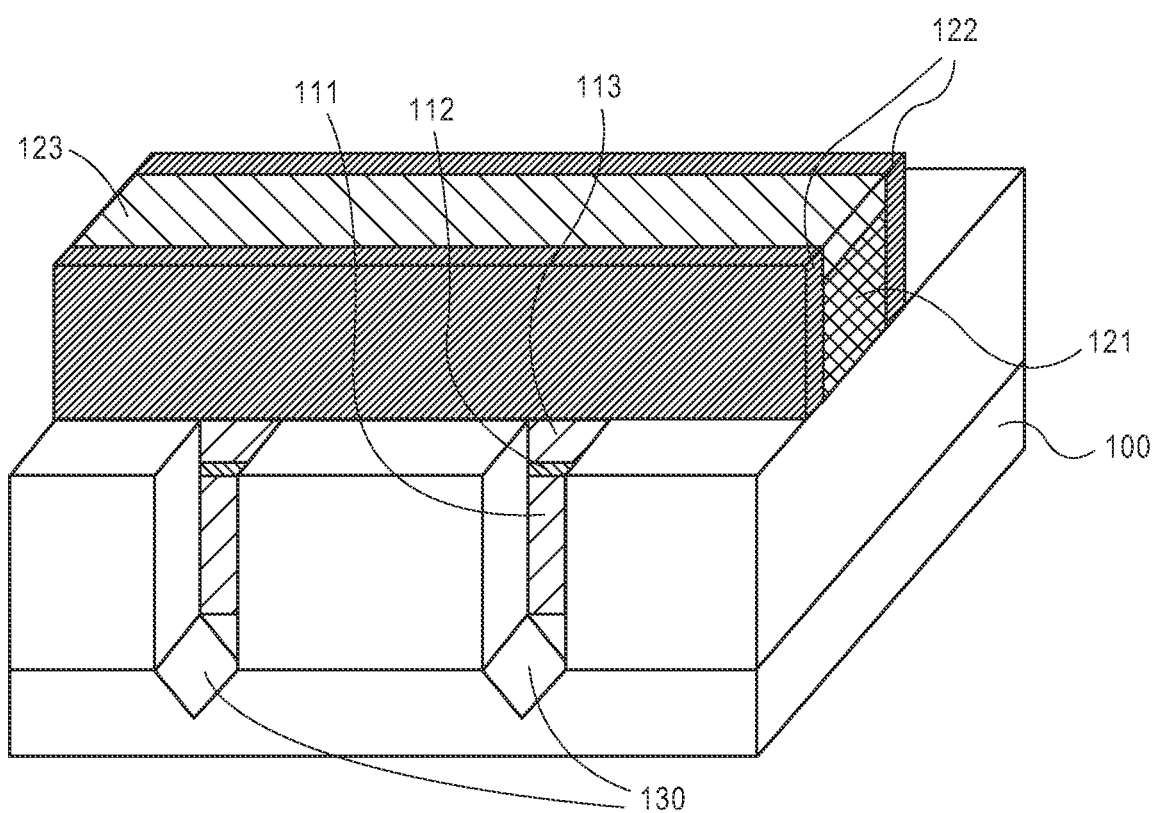
FIG. 8 illustrates a perspective view of the device after portions of the multi-layer stack are recessed to form replacement source/drain (S/D) trenches, according to an embodiment.

Referring to FIG. 8, in an embodiment of the invention, the source and drain regions are formed at this stage of the process. In such embodiment, the portion of multi-layer stack 110 within the trench 103 that are not capped by the sacrificial gate electrode 121 and the sidewall spacer 122 are recessed to form a source/drain (S/D) trench 130. The multi-layer stack 110 may be recessed with conventional etching methods such as wet etching or plasma dry etching. Since the multi-layer stack 110 comprises layers of different materials, one or more different etching processes may be utilized in order to remove each layer. In an embodiment, etching process will at least remove the cap layer 113 and the channel layer 112. In an embodiment, a portion of the buffer layer 111 may remain on the bottom of the S/D trench 130. In an additional embodiment, the recessing process may completely remove the exposed portions of the multi-layer stack 110 and leave the substrate 100 exposed.

Figure 9:
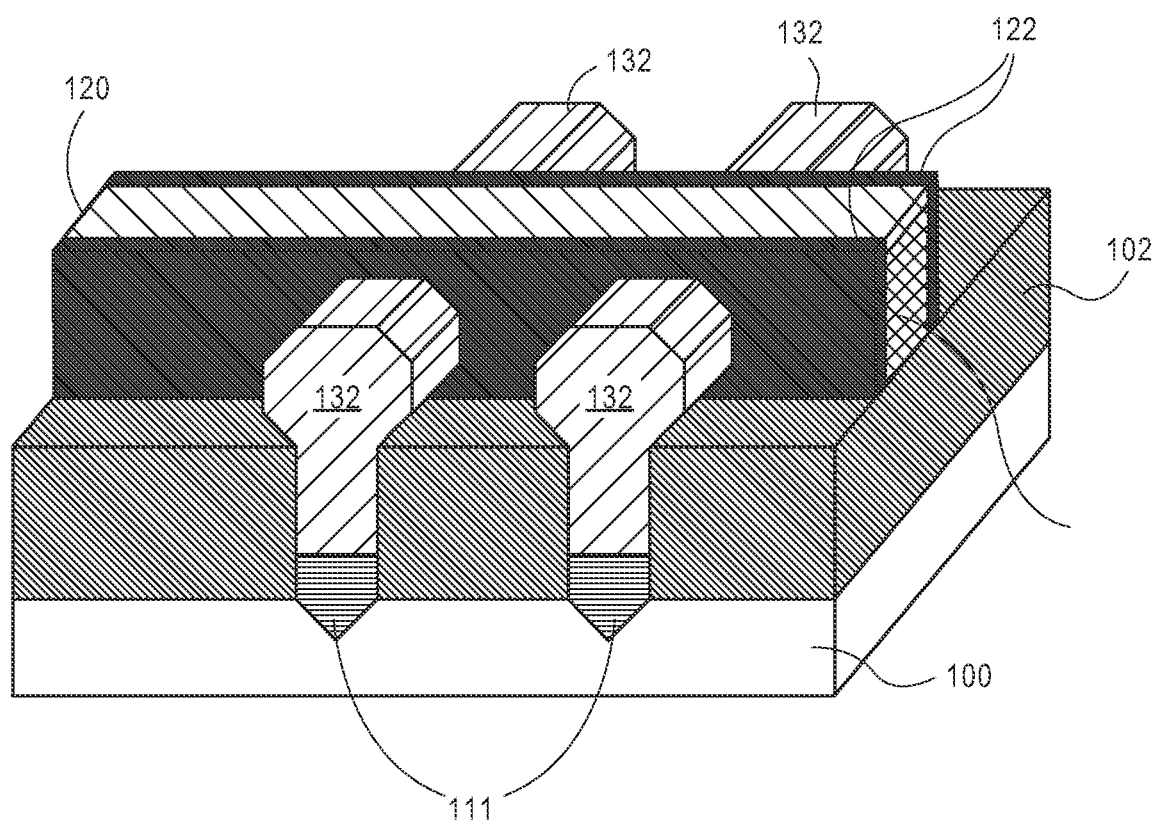
FIG. 9 illustrates a perspective view of the device after a replacement S/D region is formed in the S/D trenches.

Referring to FIG. 9, replacement S/D regions 132 may be formed in the S/D trenches 130. In an embodiment, the replacement S/D regions 132 are formed using conventional epitaxial deposition methods such as low pressure chemical vapor deposition, vapor phase epitaxy, and molecular beam epitaxy. In an embodiment, the replacement S/D regions 132 mechanically and electrically couple with the portions of the multi-layer stack 110 that are formed below the sacrificial gate electrode 120 and the sidewall spacers 122. As the replacement S/D regions 132 extend above the S/D trench 130, the growth is no longer confined, and the S/D regions 132 may begin expanding laterally towards each other. In an embodiment, the multi-layer stacks are formed with a pitch that is large enough to prevent the replacement S/D regions 132 from merging together, as illustrated in FIG. 9.

In an embodiment of the invention, the replacement S/D regions 132 may be formed using a silicon alloy such as silicon germanium or silicon carbide. In some implementations the epitaxially deposited silicon alloy may be doped in situ with dopants such as boron, arsenic, or phosphorous. In further embodiments, the replacement S/D regions 132 may be formed using one or more alternate semiconductor materials such as germanium or a III-V material or alloy. And in further embodiments, one or more layers of metal and/or metal alloys may be used to form the replacement S/D regions 132. Embodiments may include a replacement S/D region that has a higher conductivity than the multi-layer stack 110, and therefore may produce a more efficient device While FIGS. 8 and 9 illustrate the use of replacement S/D regions 132 that are formed by etching away the exposed portions of the multi-layer stack 110 and then epitaxially growing or depositing replacement S/D regions 132, embodiments of the invention are not limited to such configurations. For example, the exposed portions of the multi-layer stack 110 may not be etched away and are, instead, maintained to form the source and drain regions for the device. In such embodiments, the exposed portions of the multi-layer stack 110 may be doped after the formation of the sacrificial gate electrode 121 and the sidewall spacers 122. The doping may be performed with well-known techniques, such as ion implantation to form source and drain regions of a desired conductivity type and concentration level.

Figure 10A:
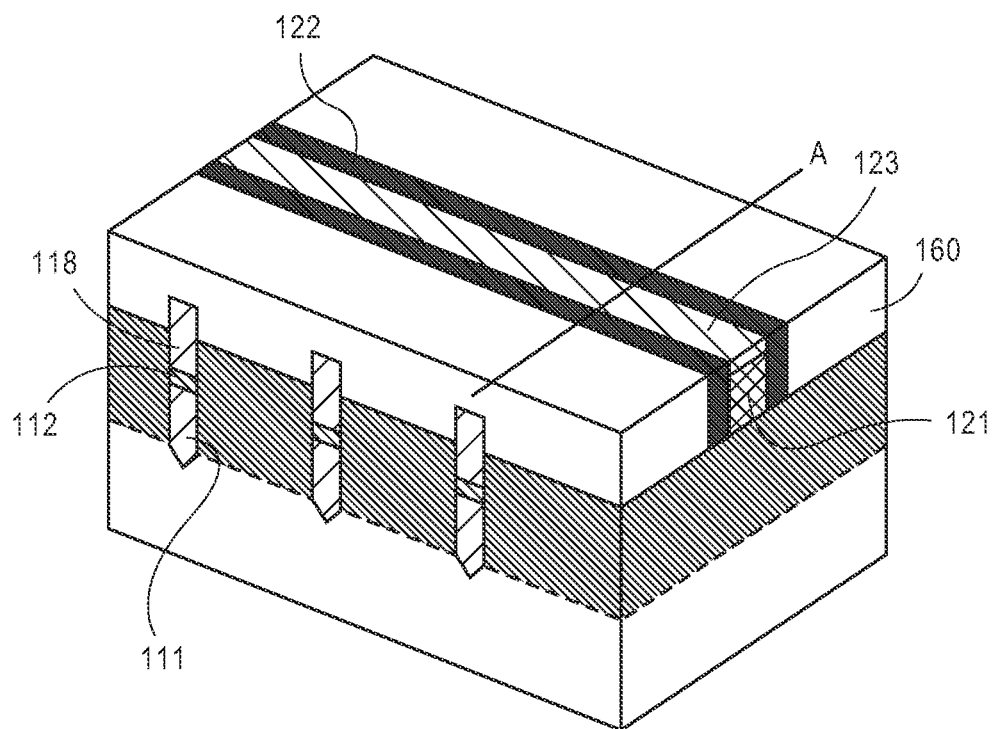
FIG. 10A illustrates a perspective view of the device after an interlayer dielectric (ILD) is formed over the exposed surfaces, according to an embodiment.
Figure 10B:
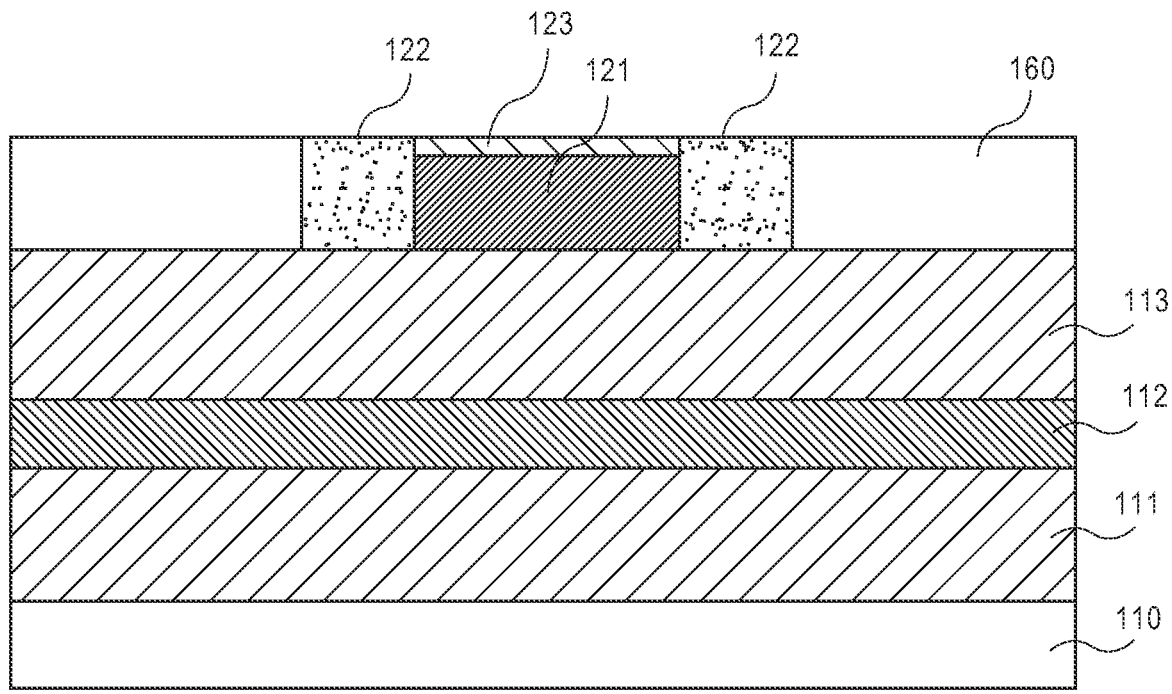
FIG. 10B illustrates a cross-sectional view of the device illustrated in FIG. 10A along the line A, according to an embodiment.

In an alternative embodiment, the fabrication of the S/D regions is delayed until after the S/D contacts are formed. Whether the S/D regions are formed after formation of the dummy gate or delayed until after the fabrication of S/D contacts, an inter-layer dielectric (ILD) layer 160 is blanket deposited over the exposed surfaces. In an embodiment, no S/D regions are formed for the device. Referring to FIG. 10A an embodiment of the invention is shown where the formation of S/D regions has been delayed until after the fabrication of S/D contacts. In such an embodiment, the channel layer 112 is only exposed at the final stage and it is further protected against defects and contaminations. By way of example, the ILD layer 160 may be deposited using a conventional technique, such as CVD. In an embodiment, ILD layer 160 may be any dielectric material such as, but not limited to undoped silicon oxide, doped silicon oxide (e.g., BPSG, PSG), silicon nitride, and silicon oxynitride. After ILD layer 160 is deposited, any overburden may then be polished back using a conventional chemical mechanical planarization method to expose a top surface of the sacrificial gate electrode 121 and top surfaces of the pair of sidewall spacers 122 as shown in FIG. 10. FIG. 10B is a two-dimensional cross-sectional view along line A in FIG. 10.

Figure 11A:
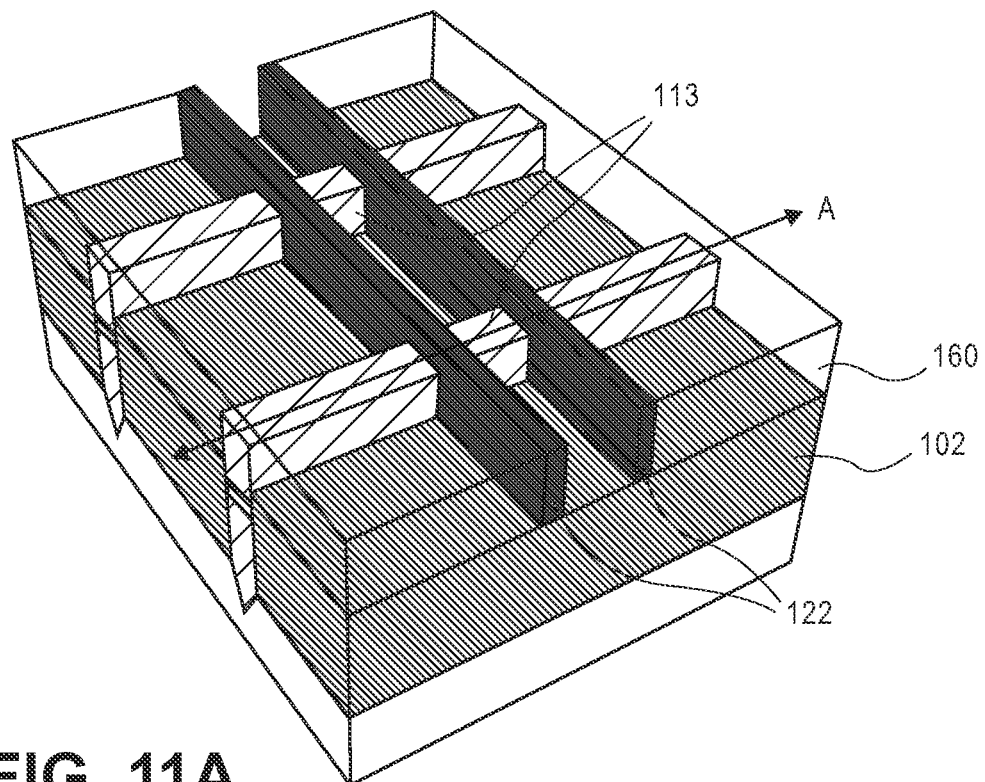
FIG. 11A illustrates a perspective view of the device after the sacrificial gate electrode is removed, according to an embodiment.
Figure 11B:
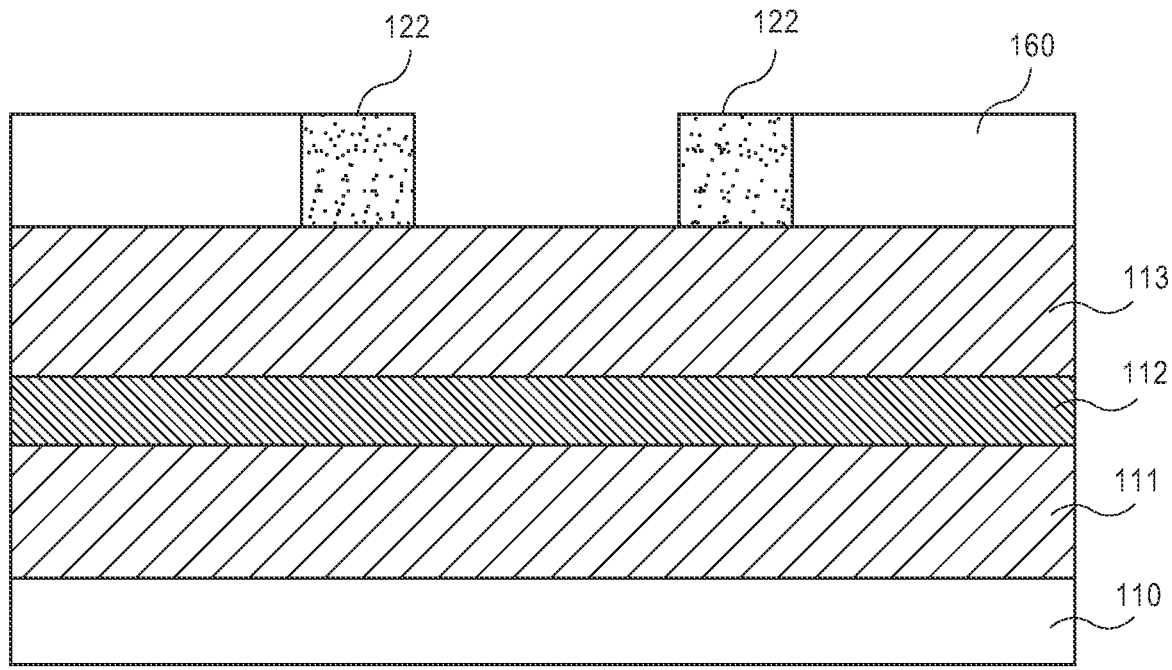
FIG. 11B illustrates a cross-sectional view of the device illustrated in FIG. 11A along the line A, according to an embodiment.

Referring to FIG. 11A, the sacrificial gate electrode 121 may be removed to expose the cap layer 113. FIG. 11B illustrates a two-dimensional cross-sectional view along line A in FIG. 11A. In an embodiment, the sacrificial gate electrode 121 can be removed utilizing a wet etching process. The wet etching process may utilize Tetramethylammonium hydroxide pentahydrate (TMAH) or a mixed solution of nitric acid and Hydrofluoric Acid can be used in the wet etching process to remove the sacrificial gate electrode 121.

Figure 12A:
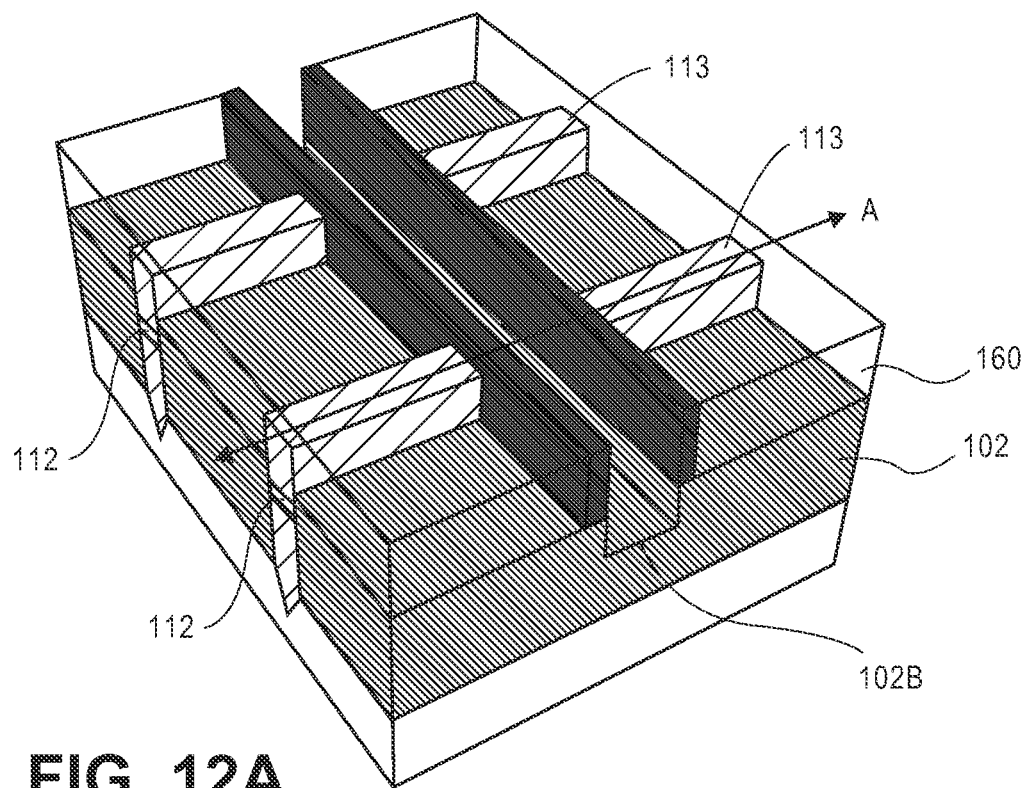
FIG. 12A illustrates a perspective view of the device after the STI layer within the sidewall spacers is recessed and the cap layer and the buffer layer are etched to expose channel layer, according to an embodiment.
Figure 12B:
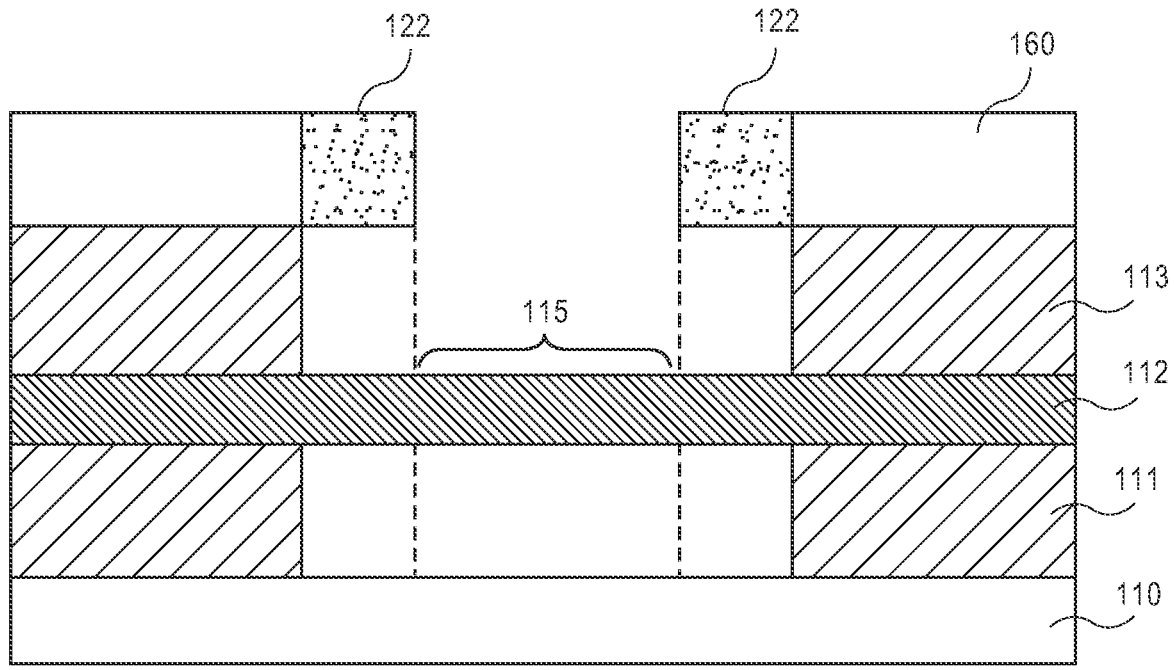
FIG. 12B illustrates a cross-sectional view of the device illustrated in FIG. 12A along the line A, according to an embodiment.

Referring to FIG. 12A and FIG. 12B, which is a cross-sectional view along line A in FIG. 12A, the portion of the STI layer 102 between the two sidewall spacers 122 (the gate region) are recessed such that the channel layer 112 is exposed by the sides for the first time. In an embodiment, a small portion of the buffer layer 111 is also exposed. For example, the recess depth of the buffer layer 111 could be 10-20 nm. This is to ensure that the etching action is effective to etch the cap 113 and buffer 111 at the same time. In an embodiment, the top surface 102b of the portion of the STI layer 102 in the gate region is 20-30 nm below the top portion of the STI layer 102 outside the gate region. In an embodiment, any appropriate etching process such as HF etching or a dry plasma process may be used to recess the STI layer within the two sidewall spacers 122.

Referring to FIG. 12A and FIG. 12B, portions of the cap layer 113 and the buffer layer 111 in the gate region may be selectively etched away to expose the channel layer 112 from the top and the bottom. In an embodiment, portions of the cap layer 113 and the buffer layer 111 underneath the sidewall spacers 122 are also etched as shown in FIG. 12B. The exposed portion of the channel layer 112 within the gate region is referred to as nanowire channel 115. The cap layer 113 and the buffer layer 111 may be removed using any well-known etchant that selectively removes the cap layer 113 and the buffer layer 111 at a significantly higher rate than the channel layer 112. By way of example, a wet etchant that includes a mixture of HCl and $H_2SO_4$ may selectively etch an InP release layer 134 over an InGaAs nanowire channel 136. The removal of the cap layer 113 and the buffer layer 111 results in the formation of a gap between the nanowire channel 115 and the substrate 100. According to an embodiment, the gap between the nanowire channel 115 and the substrate 110 is large enough to allow a gate dielectric material and the gate electrode to be formed between them. By way of example, the gap may have a thickness that is between approximately 5 and 30 nm.

Figure 13:
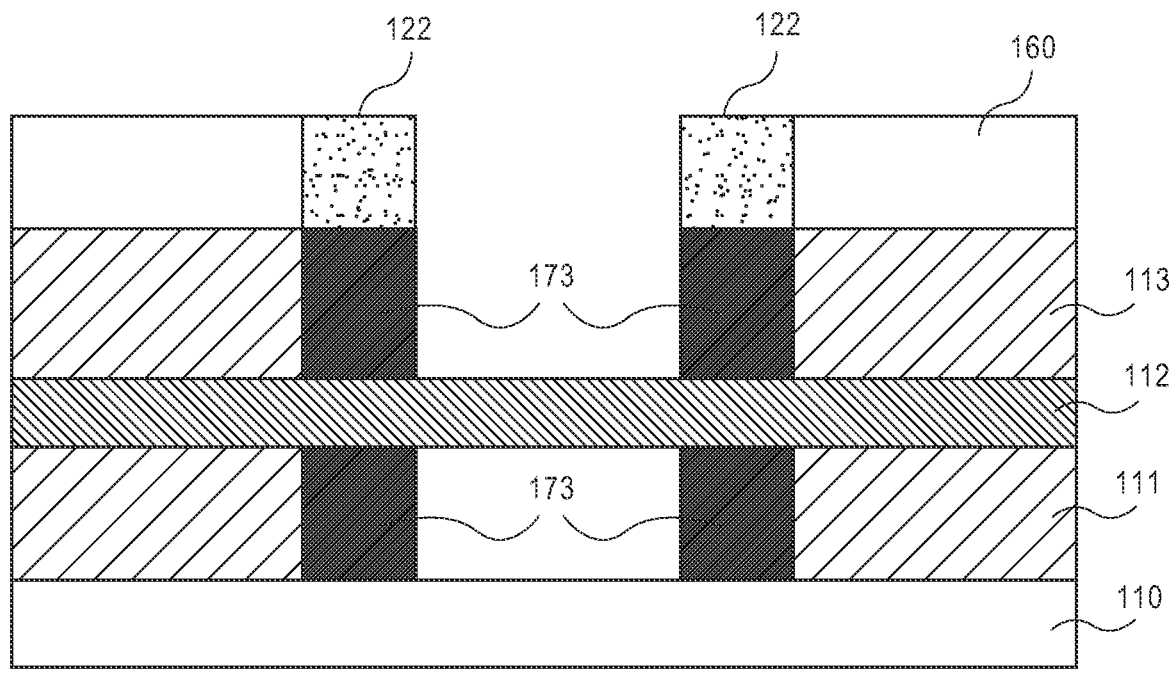
FIG. 13 illustrates a cross-sectional view of the device illustrated in FIG. 12A along the line A after formation of internal spacers, according to an embodiment.

Referring to FIG. 13, in an embodiment, internal spacer layers 173 are formed between the gate region and the unetched portion of the cap layer 113 and buffer layer 111 according to methods well known in the art. The internal spacer layers 173 may be formed of any appropriate insulator material to prevent leakage where the gate dielectric layer 170 fails. In an embodiment, the internal spacer layers 173 are aligned with side surfaces of the sidewall spacers 122 and as such have a same width as the as the sidewall spacers 122. The internal spacer layers 173 may fill the gap underneath the sidewall spacers 122 as shown in FIG. 13. In an embodiment, the internal spacer layers 173 protect against shorting and leakage, and reduce overlap capacitance between the gate structure on one side and conductive or semiconductive materials later formed on the other side of the internal spacer layers 173.

Figure 14A:
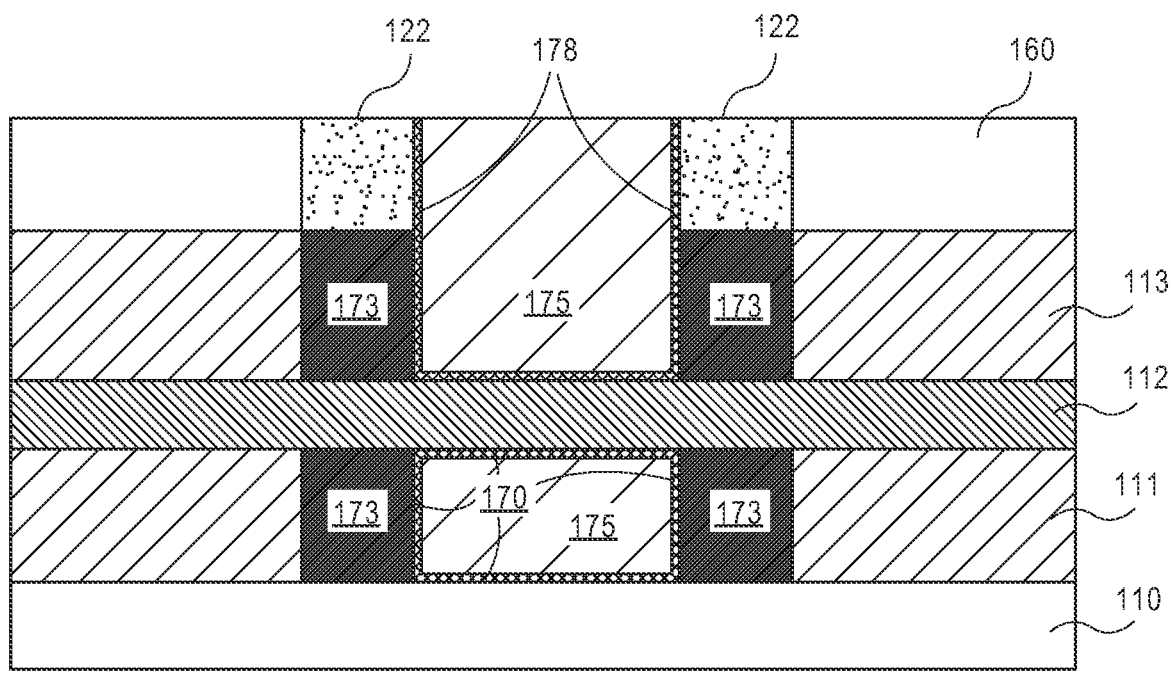
FIG. 14A illustrates a cross-sectional view of the device illustrated in FIG. 12A along the line A after a gate dielectric and a gate electrode is applied, according to an embodiment.

Referring to FIG. 14A, a gate structure is formed in the gate region, completely surrounding the nanowire channel 115. In an embodiment, the gate structure comprises a gate dielectric layer 170 and a gate electrode 175. In an embodiment, a gate dielectric layer 170 is formed over the exposed surfaces of the nanowire channel 115. In an embodiment, the gate dielectric layer 170 may also be formed along the exposed sidewalls of the internal spacers 173, exposed sidewalls of the sidewall spacers 122, and over the exposed portion of the substrate 100. Gate dielectric layer 170 may be formed from any well-known gate dielectric material such as, but not limited to silicon oxide, silicon nitride, hafnium oxide, and silicon oxynitride. In an embodiment, the gate dielectric layer 170 is formed using a highly conformal deposition method such as low pressure chemical vapor deposition (LPCVD), atomic layer deposition (ALD), or spin-on-dielectric process.

Referring to FIG. 14A, according to one embodiment of the invention, a gate electrode material may be deposited over the gate dielectric layer 170 to form a gate electrode 175. The gate electrode 175 fills the space left from the removal of the portion of the cap layer 113 and the buffer layer 111 in the gate region. According to an embodiment, the gate electrode 175 is deposited using a conformal deposition process such as atomic layer deposition (ALD) to ensure that gate electrode 175 is formed on the gate dielectric layer 170 and around the nanowire channel 115. The blanket gate electrode material may then be chemically mechanically planarized until the top surface of the gate electrode 175 is at the same height as the ILD layer 160 as illustrated in FIG. 14A.

Each MOS transistor includes a gate stack formed of at least two layers, a gate dielectric layer and a gate electrode layer. The gate dielectric layer may include one layer or a stack of layers. The one or more layers may include silicon oxide, silicon dioxide (SiO2) and/or a high-k dielectric material. The high-k dielectric material may include elements such as hafnium, silicon, oxygen, titanium, tantalum, lanthanum, aluminum, zirconium, barium, strontium, yttrium, lead, scandium, niobium, and zinc. Examples of high-k materials that may be used in the gate dielectric layer include, but are not limited to, hafnium oxide, hafnium silicon oxide, lanthanum oxide, lanthanum aluminum oxide, zirconium oxide, zirconium silicon oxide, tantalum oxide, titanium oxide, barium strontium titanium oxide, barium titanium oxide, strontium titanium oxide, yttrium oxide, aluminum oxide, lead scandium tantalum oxide, and lead zinc niobate. In some embodiments, an annealing process may be carried out on the gate dielectric layer to improve its quality when a high-k material is used.

The gate electrode layer is formed on the gate dielectric layer and may consist of at least one P-type workfunction metal or N-type workfunction metal, depending on whether the transistor is to be a PMOS or an NMOS transistor. In some implementations, the gate electrode layer may consist of a stack of two or more metal layers, where one or more metal layers are workfunction metal layers and at least one metal layer is a fill metal layer.

For a PMOS transistor, metals that may be used for the gate electrode include, but are not limited to, ruthenium, palladium, platinum, cobalt, nickel, and conductive metal oxides, e.g., ruthenium oxide. A P-type metal layer will enable the formation of a PMOS gate electrode with a workfunction that is between about 4.9 eV and about 5.2 eV. For an NMOS transistor, metals that may be used for the gate electrode include, but are not limited to, hafnium, zirconium, titanium, tantalum, aluminum, alloys of these metals, and carbides of these metals such as hafnium carbide, zirconium carbide, titanium carbide, tantalum carbide, and aluminum carbide. An N-type metal layer will enable the formation of an NMOS gate electrode with a workfunction that is between about 3.9 eV and about 4.2 eV.

In some implementations, the gate electrode may consist of a "U"-shaped structure that includes a bottom portion substantially parallel to the surface of the substrate and two sidewall portions that are substantially perpendicular to the top surface of the substrate. In another implementation, at least one of the metal layers that form the gate electrode may simply be a planar layer that is substantially parallel to the top surface of the substrate and does not include sidewall portions substantially perpendicular to the top surface of the substrate. In further implementations of the invention, the gate electrode may consist of a combination of U-shaped structures and planar, non-U-shaped structures. For example, the gate electrode may consist of one or more U-shaped metal layers formed atop one or more planar, non-U-shaped layers.

The resultant transistor device formed using the method described is a non-planar gate all-around device with a nanowire channel, in accordance with an embodiment of the present invention.

Figure 14B:
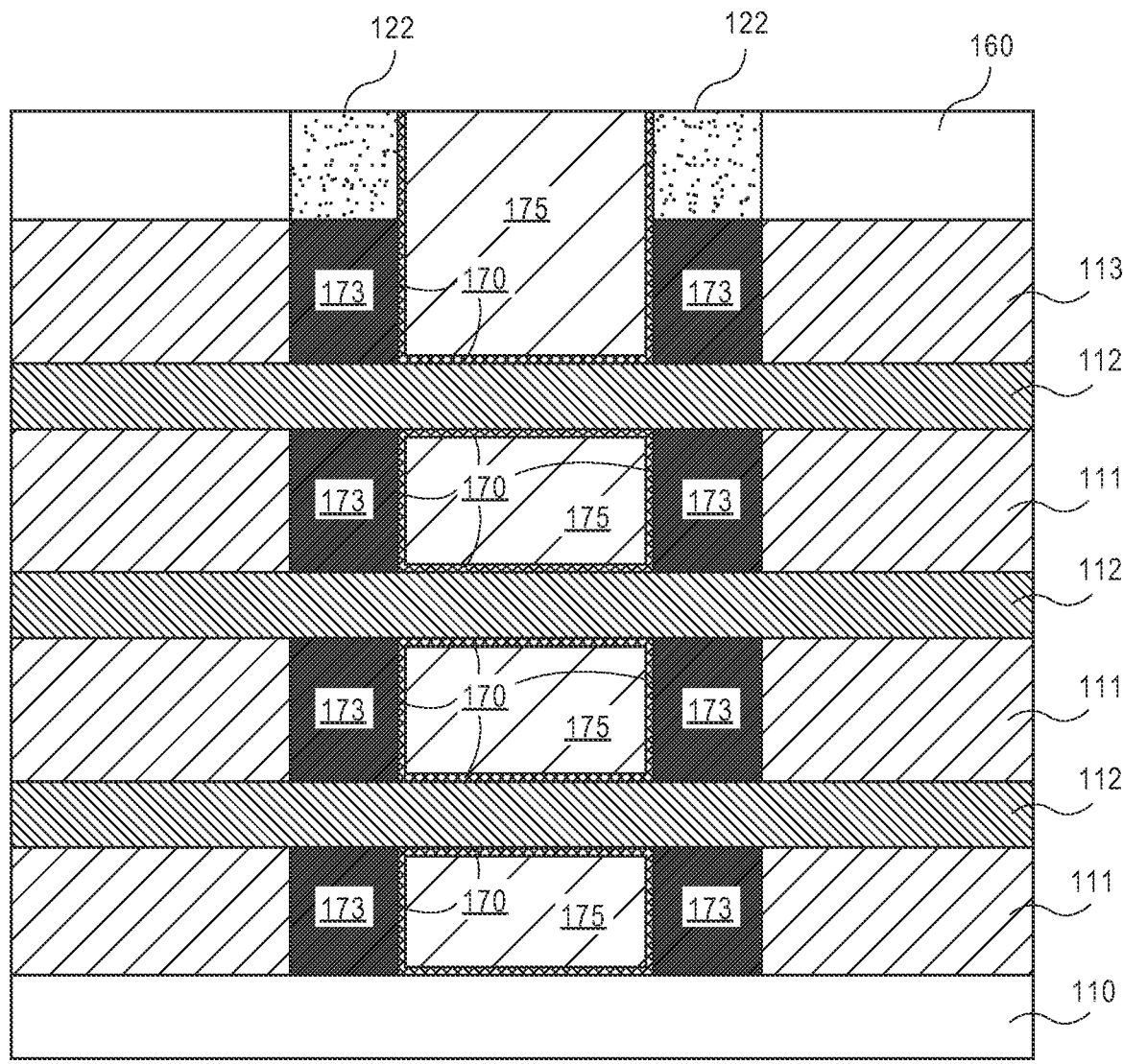
FIG. 14B illustrates a cross-sectional view of the device illustrated in FIG. 12A along the line A after a gate dielectric and a gate electrode is applied to a device with multiple nanowire channels, according to an embodiment.

FIG. 14B illustrates formation of the gate structure in the gate region of a device with multiple channel layers 112. In an embodiment, the gate structure comprises a gate dielectric layer 170 and a gate electrode 175. As shown in FIG. 14B, the gate structure completely surrounds the portion of the channel layers 112 between the two internal spacers 173. Such an embodiment, may allow for a plurality of nanowires to be formed between each replacement Source and Drain regions. While three channel layers 112 are shown in FIG. 14B, it is to be appreciated that embodiments may also include two channel layers, or more than three channel layers. Aside from the formation of gate structure surrounding a multiple nanowire channels, the processing necessary to form the device illustrated in FIG. 14B may be substantially similar to the processing described in details above.

Figure 15:
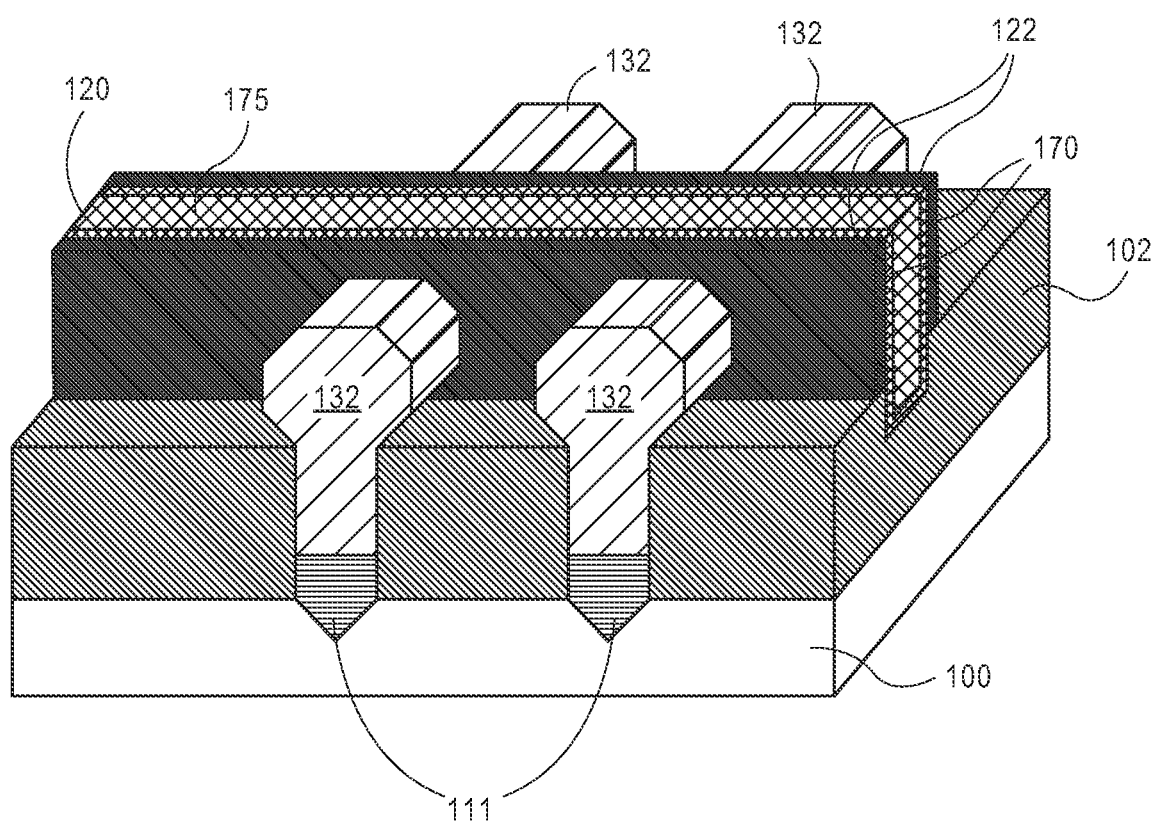
FIG. 15 perspective view of the device after formation of the S/D regions, according to an embodiment.

FIGS. 8 and 9 described forming the replacement S/D regions after formation of sacrificial gate. In an embodiment, no S/D regions are formed. In an alternative embodiment, as explained above, the formation of the of the replacement S/D regions 132 is delayed until after the formation of the gate structure 120. FIG. 15 shows the device after formation of the replacement S/D regions 132 and gate structure 120. In an embodiment, the replacement S/D regions 132 mechanically and electrically couple with the nanowire channel formed below the gate electrode 175 and the sidewall spacers 122. The process necessary to form the replacement S/D regions 132 after the formation of the gate structure 120 may be substantially similar to the process of forming the replacement S/D 132 explained in detail above with respect to FIG. 8 and FIG. 9, and therefore will not be repeated here.

Figure 16:
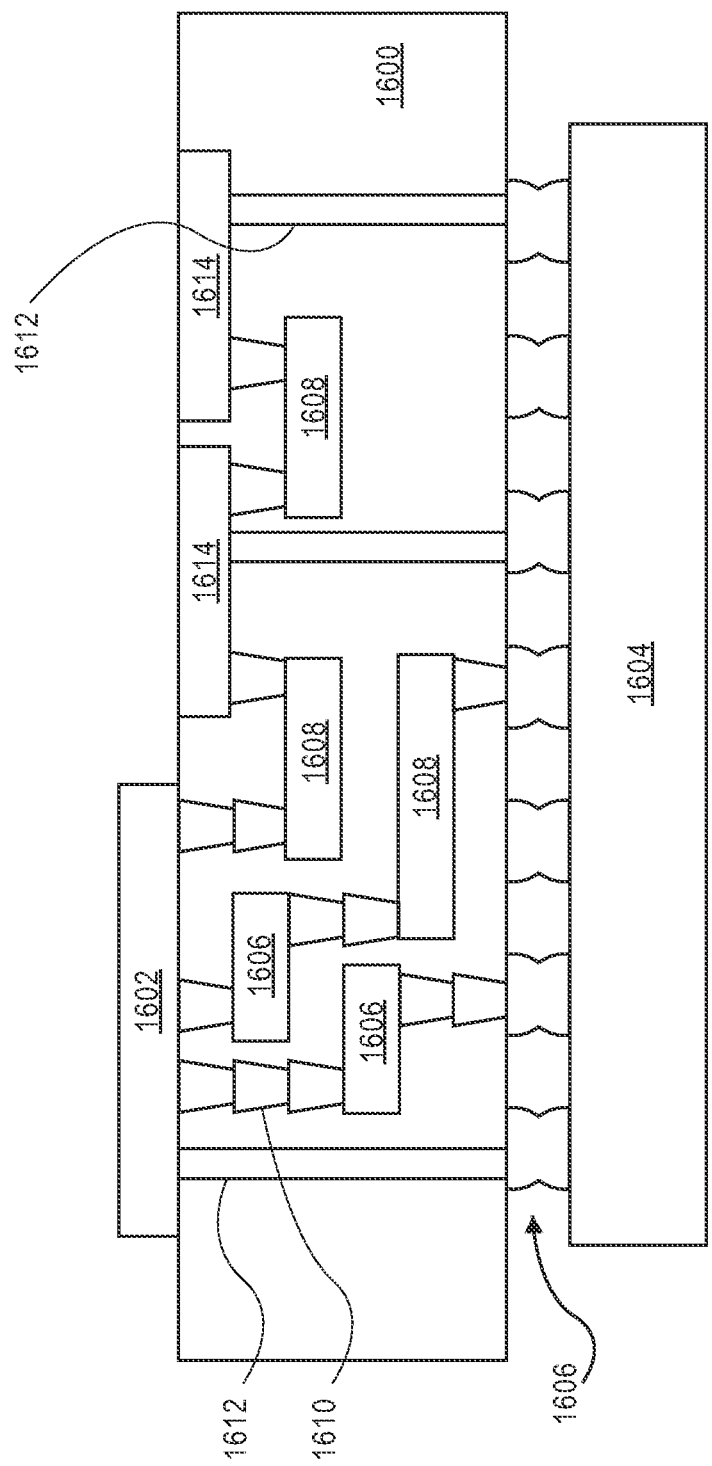
FIG. 16 is a cross-sectional illustration of an interposer implementing one or more embodiments of the invention.

FIG. 16 illustrates an interposer 1600 that includes one or more embodiments of the invention. The interposer 1600 is an intervening substrate used to bridge a first substrate 1602 to a second substrate 1604. The first substrate 1602 may be, for instance, an integrated circuit die. The second substrate 1604 may be, for instance, a memory module, a computer motherboard, or another integrated circuit die. Generally, the purpose of an interposer 1600 is to spread a connection to a wider pitch or to reroute a connection to a different connection. For example, an interposer 1600 may couple an integrated circuit die to a ball grid array (BGA) 1606 that can subsequently be coupled to the second substrate 1604. In some embodiments, the first and second substrates 1602/1604 are attached to opposing sides of the interposer 1600. In other embodiments, the first and second substrates 1602/1604 are attached to the same side of the interposer 1600. And in further embodiments, three or more substrates are interconnected by way of the interposer 1600.

The interposer 1600 may be formed of an epoxy resin, a fiberglass-reinforced epoxy resin, a ceramic material, or a polymer material such as polyimide. In further implementations, the interposer may be formed of alternate rigid or flexible materials that may include the same materials described above for use in a semiconductor substrate, such as silicon, germanium, and other group III-V and group IV materials.

The interposer may include metal interconnects 1608 and vias 1610, including but not limited to through-silicon vias (TSVs) 1612. The interposer 1600 may further include embedded devices 1614, including both passive and active devices. Such devices include, but are not limited to, capacitors, decoupling capacitors, resistors, inductors, fuses, diodes, transformers, sensors, and electrostatic discharge (ESD) devices. More complex devices such as radio-frequency (RF) devices, power amplifiers, power management devices, antennas, arrays, sensors, and MEMS devices may also be formed on the interposer 1600.

In accordance with embodiments of the invention, apparatuses or processes disclosed herein, such as nanowire or nanoribbon channels that are formed from a multi-layer stack in an ART trench, may be used in the fabrication of interposer 1600 or more specifically, the devices 1614 or any other structure that includes a transistor within the interposer.

Figure 17:
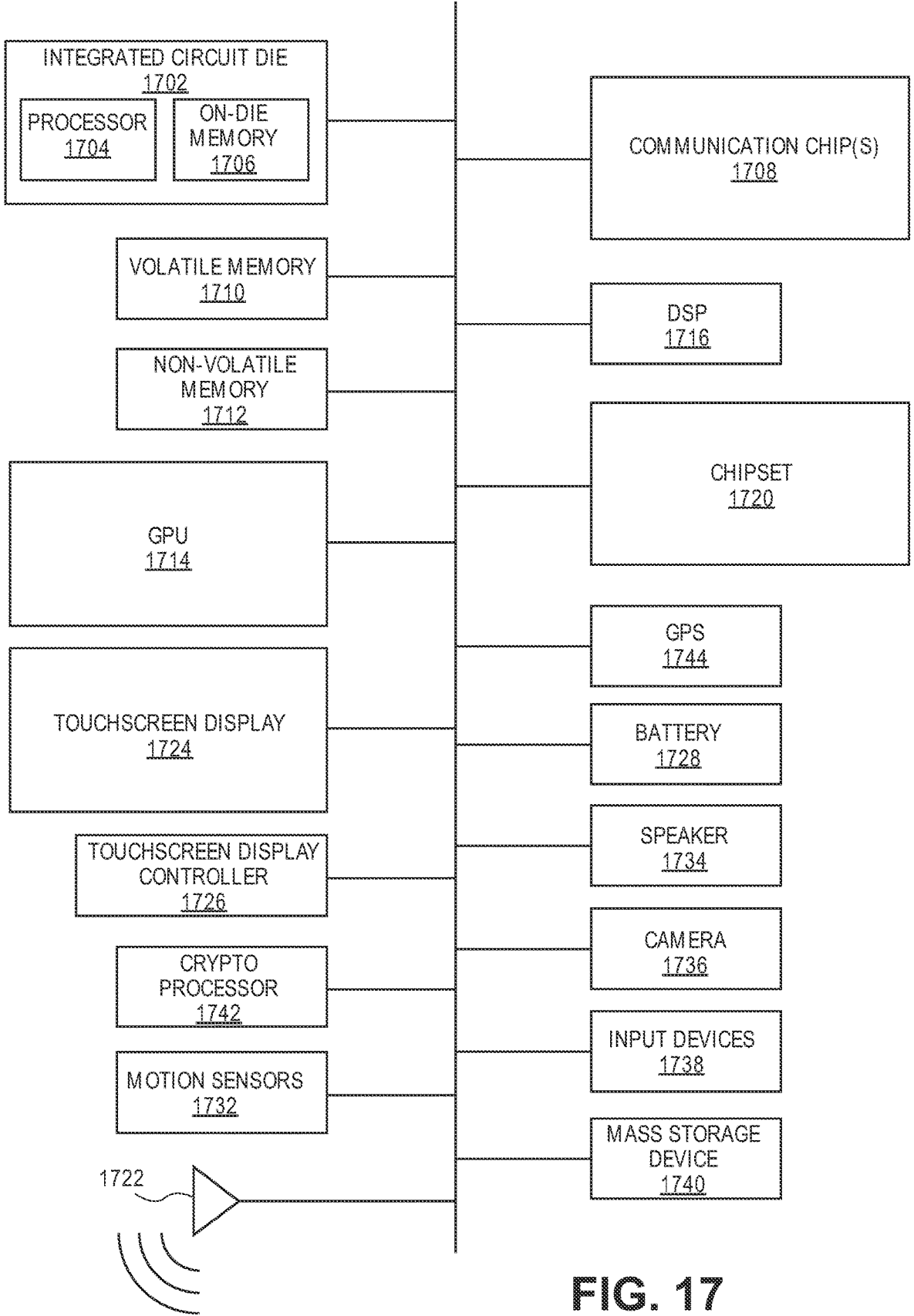
FIG. 17 is a schematic of a computing device built in accordance with an embodiment of the invention.

FIG. 17 illustrates a computing device 1700 in accordance with one embodiment of the invention. The computing device 1700 may include a number of components. In one embodiment, these components are attached to one or more motherboards. In an alternate embodiment, these components are fabricated onto a single system-on-a-chip (SoC) die rather than a motherboard. The components in the computing device 1700 include, but are not limited to, an integrated circuit die 1702 and at least one communication chip 1708. In some implementations the communication chip 1708 is fabricated as part of the integrated circuit die 1702. The integrated circuit die 1702 may include a CPU 1704 as well as on-die memory 1706, often used as cache memory, that can be provided by technologies such as embedded DRAM (eDRAM) or spin-transfer torque memory (STTM or STTM-RAM).

Computing device 1700 may include other components that may or may not be physically and electrically coupled to the motherboard or fabricated within an SoC die. These other components include, but are not limited to, volatile memory 1710 (e.g., DRAM), non-volatile memory 1712 (e.g., ROM or flash memory), a graphics processing unit 1714 (GPU), a digital signal processor 1716, a crypto processor 1742 (a specialized processor that executes cryptographic algorithms within hardware), a chipset 1720, an antenna 1722, a display or a touchscreen display 1724, a touchscreen controller 1726, a battery 1728 or other power source, a power amplifier (not shown), a global positioning system (GPS) device 1728, a compass 1730, a motion coprocessor or sensors 1732 (that may include an accelerometer, a gyroscope, and a compass), a speaker 1734, a camera 1736, user input devices 1738 (such as a keyboard, mouse, stylus, and touchpad), and a mass storage device 1740 (such as hard disk drive, compact disk (CD), digital versatile disk (DVD), and so forth).

The communications chip 1708 enables wireless communications for the transfer of data to and from the computing device 1700. The term "wireless" and its derivatives may be used to describe circuits, devices, systems, methods, techniques, communications channels, etc., that may communicate data through the use of modulated electromagnetic radiation through a non-solid medium. The term does not imply that the associated devices do not contain any wires, although in some embodiments they might not. The communication chip 1708 may implement any of a number of wireless standards or protocols, including but not limited to Wi-Fi (IEEE 802.11 family), WiMAX (IEEE 802.16 family), IEEE 802.20, long term evolution (LTE), Ev-DO, HSPA+, HSDPA+, HSUPA+, EDGE, GSM, GPRS, CDMA, TDMA, DECT, Bluetooth, derivatives thereof, as well as any other wireless protocols that are designated as 3G, 4G, 5G, and beyond. The computing device 1700 may include a plurality of communication chips 1708. For instance, a first communication chip 1708 may be dedicated to shorter range wireless communications such as Wi-Fi and Bluetooth and a second communication chip 1708 may be dedicated to longer range wireless communications such as GPS, EDGE, GPRS, CDMA, WiMAX, LTE, Ev-DO, and others.

The processor 1704 of the computing device 1700 includes one or more devices, such as gate-all-around transistors with nanowire or nanoribbon channels, that are formed in accordance with embodiments of the invention. The term "processor" may refer to any device or portion of a device that processes electronic data from registers and/or memory to transform that electronic data into other electronic data that may be stored in registers and/or memory.

The communication chip 1708 may also include one or more devices, such as gate-all-around transistors with nanowire or nanoribbon channels that are formed from a multi-layer stack in an ART trench.

In further embodiments, another component housed within the computing device 1700 may contain one or more devices, such as gate-all-around transistors with nanowire or nanoribbon channels that are formed from a multi-layer stack in an ART trench.

In various embodiments, the computing device 1700 may be a laptop computer, a netbook computer, a notebook computer, an ultrabook computer, a smartphone, a tablet, a personal digital assistant (PDA), an ultra mobile PC, a mobile phone, a desktop computer, a server, a printer, a scanner, a monitor, a set-top box, an entertainment control unit, a digital camera, a portable music player, or a digital video recorder. In further implementations, the computing device 1700 may be any other electronic device that processes data.

The above description of illustrated implementations of the invention, including what is described in the Abstract, is not intended to be exhaustive or to limit the invention to the precise forms disclosed. While specific implementations of, and examples for, the invention are described herein for illustrative purposes, various equivalent modifications are possible within the scope of the invention, as those skilled in the relevant art will recognize.

These modifications may be made to the invention in light of the above detailed description. The terms used in the following claims should not be construed to limit the invention to the specific implementations disclosed in the specification and the claims. Rather, the scope of the invention is to be determined entirely by the following claims, which are to be construed in accordance with established doctrines of claim interpretation.

Embodiments of the invention include a method for fabricating a semiconductor device. The method includes forming a multi-layer stack within a trench formed in a shallow trench isolation (STI) layer, wherein the multi-layer stack comprises at least a channel layer, a buffer layer formed below the channel layer, and a cap layer formed above the channel layer, recessing the STI layer so that a top surface of the STI layer is above a top surface of the channel layer, and exposing the channel layer by an etching process that selectively removes the buffer layer and the cap layer relative to the channel layer.

In one embodiment may also include a method for fabricating a semiconductor device, wherein the channel layer is epitaxially grown on the buffer layer thin enough to conform to the buffer layer without introducing misfit dislocations.

An additional embodiment may also include a method for fabricating a semiconductor device, wherein a thickness of the channel layer is smaller than its critical thickness.

An additional embodiment may also include a method for fabricating a semiconductor device, wherein recessing the STI layer so that a top surface of the STI layer is below a top surface of the cap layer.

An additional embodiment may also include a method for fabricating a semiconductor device, wherein the etching process selectively removes the STI layer in a gate region to expose the channel.

An additional embodiment may also include a method for fabricating a semiconductor device, wherein the buffer layer and the cap layer are of a same material.

An additional embodiment may also include a method for fabricating a semiconductor device, wherein the buffer layer, the cap layer, and the channel layer are each a III-V semiconductor material.

An additional embodiment may also include a method for fabricating a semiconductor device, wherein the channel layer comprises a material selected from InGaAs, InAs, InSb and, wherein the buffer and cap layers comprise a material selected from are GaAs, InP, GaAsSb, AlAsSb, GaP, and AlGaAs.

An additional embodiment may also include a method for fabricating a semiconductor device, wherein the top surface of the cap layer is above the top surface of the STI layer.

An additional embodiment may also include forming a sacrificial gate electrode over a portion of the cap layer and the STI layer subsequent to recessing the STI layer and depositing sidewall spacers along sidewalls of the sacrificial gate electrode to form a gate region between the sidewall spacers.

An additional embodiment may also include removing portions of the multi-layer stack that are not within the gate region and forming replacement source and drain regions where the portions of the multi-layer stack were removed.

An additional embodiment may also include forming an interlayer dielectric (ILD) layer over the portions of the STI layer and the cap layer that are not within the gate region.

An additional embodiment may also include removing the sacrificial gate electrode to expose the cap layer in the gate region, recessing the STI layer in the gate region below a top surface of the buffer layer prior to exposing the channel layer, depositing a gate dielectric layer over the exposed surfaces of the channel layer in the gate region, and depositing a gate electrode on the gate dielectric and surrounding channel layer within the gate region.

Embodiments of the invention include a method for fabricating a semiconductor device. The method include forming a trench in a shallow trench isolation (STI) layer on a substrate, depositing a buffer layer in a lower portion of the trench, growing a pseudomorphic channel layer on the buffer layer, wherein the pseudomorphic channel layer is thin enough to conform with the buffer layer without introducing misfit dislocations, depositing a cap layer on top of the pseudomorphic channel layer in the trench, recessing the STI layer to expose the cap layer, forming a sacrificial gate electrode over a portion of the cap layer and the STI layer, depositing sidewall spacers along sidewalls of the sacrificial gate electrode to form a gate region between the sidewall spacers, forming an interlayer dielectric (ILD) layer over the portions of the STI layer and the cap layer that are not within the gate region, removing the sacrificial gate electrode to expose the cap layer in the gate region, recessing the STI layer in the gate region below a top surface of the buffer layer, exposing the channel layer by an etching process that selectively removes the buffer layer and the cap layer relative to the channel layer, depositing a gate dielectric layer over the exposed surfaces of the channel layer in the gate region, and depositing a gate electrode on the gate dielectric and surrounding channel layer within the gate region.

An additional Embodiment of the invention may include a method for fabricating a semiconductor device, wherein a thickness of the channel layer is smaller than its critical thickness.

An additional Embodiment of the invention may include a method for fabricating a semiconductor device, wherein the buffer layer and the cap layer are of a same material.

An additional Embodiment of the invention may include a method for fabricating a semiconductor device, wherein the buffer layer is a III-V semiconductor material, the cap layer is a III-V semiconductor material, and the channel layer is a III-V semiconductor material.

An additional Embodiment of the invention may include a method for fabricating a semiconductor device, wherein the III-V semiconductor material channel layer comprises a material selected from the group consisting of InGaAs, InAs, InSb, and wherein the buffer and cap layers comprise a material selected from the group consisting of GaAs, InP, GaAsSb, AlAsSb, GaP, and AlGaAs.

An additional Embodiment of the invention may include a method for fabricating a semiconductor device, wherein a thickness of the channel layer is smaller than its critical thickness.

An additional embodiment of the invention may include a semiconductor device including a gate structure completely surrounding a nanowire channel in a gate region, and a source region and a drain region on opposite ends of the nanowire channel at least partially formed within trenches in an STI layer on opposite sides of the gate region, wherein a top surface of the STI layer is above a top surface of the channel layer.

An additional embodiment of the invention may include a semiconductor device, wherein the nanowire channel has a chevron shape.

An additional embodiment of the invention may include a semiconductor device, wherein wherein a thickness of the channel layer is smaller than its critical thickness.

An additional embodiment of the invention may include a semiconductor device, wherein the channel layer comprises a material selected from the group consisting of InGaAs, InAs, InSb.

An additional embodiment of the invention may include a semiconductor device including a semiconductor device, wherein the trench has a width that is substantially equal to a width of the nanowire channel.

An additional embodiment of the invention may include a semiconductor device further comprising additional nanowire channels, each extending from the source region to the drain region, and wherein the gate structure wrapped around the additional nanowire channels in the gate region.

The invention claimed is:

1. A semiconductor device comprising:
   a shallow trench isolation (STI) layer;
   a gate structure completely surrounding a bottommost nanowire channel in a gate region, the gate structure in a gate trench in the STI layer, the gate trench having a bottom, wherein the bottom of the gate trench in the STI layer is below a bottom surface of the bottommost nanowire channel; and a source region and a drain region on opposite ends of the bottommost nanowire channel at least partially formed within trenches in the STI layer on opposite sides of the gate region, wherein a top surface of the STI layer is above a top surface of the bottommost nanowire channel, wherein a top surface of the source region is above the top surface of the STI layer, and a top surface of the drain region is above the top surface of the STI layer, and wherein a portion of the source region and a portion of the drain region are on a buffer layer, the buffer layer having a bottom surface below a bottom surface of the STI layer.

2. The semiconductor device of claim 1, wherein the bottommost nanowire channel has a chevron shape.

3. The semiconductor device of claim 1, wherein a thickness of the bottommost nanowire channel is smaller than its critical thickness.

4. The semiconductor device of claim 1, wherein the bottommost nanowire channel comprises a material selected from the group consisting of InGaAs, InAs, InSb.

5. The semiconductor device of claim 1, wherein each of the trenches in the STI layer on opposite sides of the gate region has a width that is substantially equal to a width of the bottommost nanowire channel.

6. The semiconductor device of claim 1, further comprising additional nanowire channels above the bottommost nanowire channel, each extending from the source region to the drain region, and wherein the gate structure wrapped around the additional nanowire channels in the gate region.

7. A semiconductor device comprising:
a shallow trench isolation (STI) layer;
a gate structure completely surrounding a bottommost nanowire channel in a gate region, the gate structure in a gate trench in the STI layer, the gate trench having a bottom, wherein the bottom of the gate trench in the STI layer is below a bottom surface of the bottommost nanowire channel, and wherein the bottommost nanowire channel has a chevron shape; and
a source region and a drain region on opposite ends of the bottommost nanowire channel at least partially formed within trenches in the STI layer on opposite sides of the gate region, wherein a top surface of the STI layer is above a top surface of the bottommost nanowire channel.

8. The semiconductor device of claim 7, wherein a thickness of the bottommost nanowire channel is smaller than its critical thickness.

9. The semiconductor device of claim 7, wherein the bottommost nanowire channel comprises a material selected from the group consisting of InGaAs, InAs, InSb.

10. The semiconductor device of claim 7, wherein each of the trenches in the STI layer on opposite sides of the gate region has a width that is substantially equal to a width of the bottommost nanowire channel.

11. The semiconductor device of claim 7, further comprising additional nanowire channels above the bottommost nanowire channel, each extending from the source region to the drain region, and wherein the gate structure wrapped around the additional nanowire channels in the gate region.

12. A semiconductor device comprising:
a shallow trench isolation (STI) layer;
a gate structure completely surrounding a bottommost nanowire channel in a gate region, the gate structure in a gate trench in the STI layer, the gate trench having a bottom, wherein the bottom of the gate trench in the STI layer is below a bottom surface of the bottommost nanowire channel; and
a source region and a drain region on opposite ends of the bottommost nanowire channel at least partially formed within trenches in the STI layer on opposite sides of the gate region, wherein a top surface of the STI layer is above a top surface of the bottommost nanowire channel, and wherein a portion of the source region and a portion of the drain region are on a buffer layer, the buffer layer having a bottom surface below a bottom surface of the STI layer.

13. The semiconductor device of claim 12, wherein the bottommost nanowire channel has a chevron shape.

14. The semiconductor device of claim 12, wherein a thickness of the bottommost nanowire channel is smaller than its critical thickness.

15. The semiconductor device of claim 12, wherein the bottommost nanowire channel comprises a material selected from the group consisting of InGaAs, InAs, InSb.

16. The semiconductor device of claim 12, wherein each of the trenches in the STI layer on opposite sides of the gate region has a width that is substantially equal to a width of the bottommost nanowire channel.

17. The semiconductor device of claim 12, further comprising additional nanowire channels above the bottommost nanowire channel, each extending from the source region to the drain region, and wherein the gate structure wrapped around the additional nanowire channels in the gate region.

* * * * *